United States Patent
Yoshida

(10) Patent No.: US 9,525,289 B2
(45) Date of Patent: Dec. 20, 2016

(54) BATTERY CONTROL SYSTEM AND BATTERY PACK

(71) Applicant: Tadahiro Yoshida, Kanagawa (JP)

(72) Inventor: Tadahiro Yoshida, Kanagawa (JP)

(73) Assignee: NEC ENERGY DEVICES, LTD., Sagamihara-shi, Kanagawa (JP)

( * ) Notice: Subject to any disclaimer, the term of this patent is extended or adjusted under 35 U.S.C. 154(b) by 289 days.

(21) Appl. No.: 14/381,817

(22) PCT Filed: Feb. 8, 2013

(86) PCT No.: PCT/JP2013/000709
§ 371 (c)(1),
(2) Date: Aug. 28, 2014

(87) PCT Pub. No.: WO2013/128809
PCT Pub. Date: Sep. 6, 2013

(65) Prior Publication Data
US 2015/0035495 A1   Feb. 5, 2015

(30) Foreign Application Priority Data
Feb. 29, 2012   (JP) ................................. 2012-044631

(51) Int. Cl.
*H02J 7/04* (2006.01)
*H02J 7/00* (2006.01)
(Continued)

(52) U.S. Cl.
CPC ......... *H02J 7/0014* (2013.01); *G01R 31/3606* (2013.01); *H01M 10/425* (2013.01);
(Continued)

(58) Field of Classification Search
CPC .............................................. H01M 10/443
(Continued)

(56) References Cited

U.S. PATENT DOCUMENTS

| | | | |
|---|---|---|---|
| 7,609,034 B2 * | 10/2009 | Tanjou .................. | H02J 7/0021 320/116 |
| 2010/0072947 A1 | 3/2010 | Chan et al. | |
| 2011/0121785 A1 * | 5/2011 | Iida ..................... | H01M 10/443 320/118 |

FOREIGN PATENT DOCUMENTS

| | | |
|---|---|---|
| CN | 101192756 A | 6/2008 |
| CN | 102195303 A | 9/2011 |

(Continued)

OTHER PUBLICATIONS

Communication dated Dec. 25, 2015, from the State Intellectual Property Office of People's Republic of China in counterpart Application No. 201380011559.8.

(Continued)

*Primary Examiner* — Edward Tso
*Assistant Examiner* — Ahmed Omar
(74) *Attorney, Agent, or Firm* — Sughrue Mion, PLLC

(57) ABSTRACT

A battery control unit (400) controls charge and discharge of battery cells (100) on the basis of temperatures measured by a temperature measurement unit (320) and voltages measured by the voltage and current measurement unit (340). In addition, the battery control unit (400) specifies a lowest temperature cell having the lowest temperature and a highest temperature cell having the highest temperature on the basis of the temperatures measured by the temperature measurement unit (320), when a current is greater than 0. In addition, the battery control unit (400) performs balance control for equalizing voltages of all the battery cells (100), on the basis of the voltages measured by the voltage and current measurement unit (340), when a first temperature condition in which a temperature difference $\Delta T$ between the highest temperature cell and the lowest temperature cell is equal to or greater than a reference value $T_1$ is not satisfied. On the other hand, when the temperature difference $\Delta T$ satisfies the (Continued)

first temperature condition, the battery control unit (400) does not perform the balance control.

9 Claims, 17 Drawing Sheets

(51) Int. Cl.
*H02J 7/16* (2006.01)
*H01M 10/42* (2006.01)
*H01M 10/48* (2006.01)
*G01R 31/36* (2006.01)

(52) U.S. Cl.
CPC ....... *H01M 10/482* (2013.01); *H01M 10/486* (2013.01); *H02J 7/007* (2013.01); *H02J 7/0016* (2013.01); *H02J 7/0021* (2013.01); *H02J 7/0026* (2013.01); *H02J 7/0091* (2013.01); *H01M 2010/4271* (2013.01)

(58) Field of Classification Search
USPC .................................................. 320/118, 150
See application file for complete search history.

(56) References Cited

FOREIGN PATENT DOCUMENTS

| JP | 09-322417 A | 12/1997 |
|---|---|---|
| JP | 2007-325458 A | 12/2007 |
| JP | 2009-232559 A | 10/2009 |

OTHER PUBLICATIONS

International Search Report for PCT/JP2013/000709, dated Mar. 26, 2013 (PCT ISA 210).

\* cited by examiner

FIG. 6
(a)
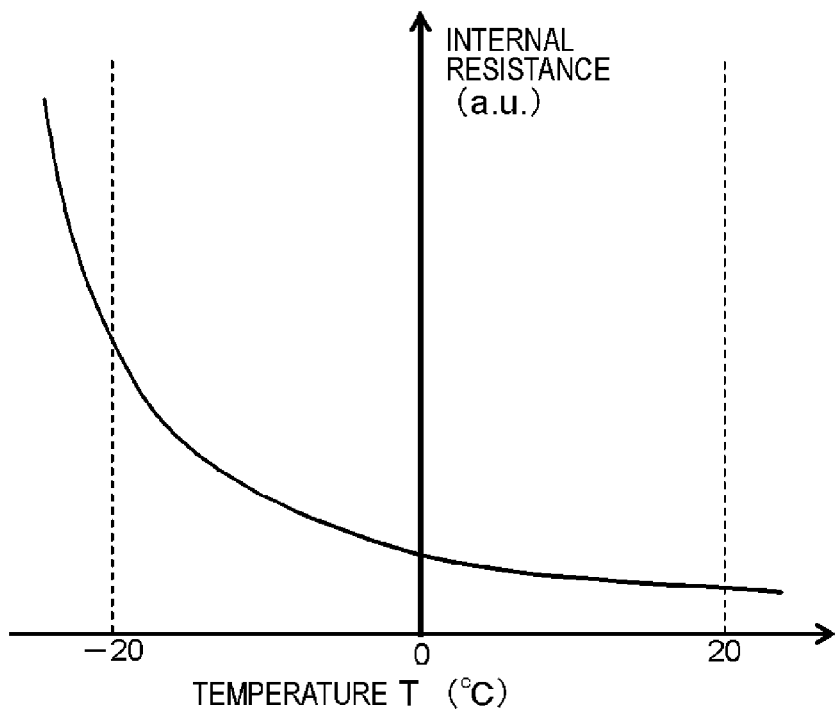
(b)
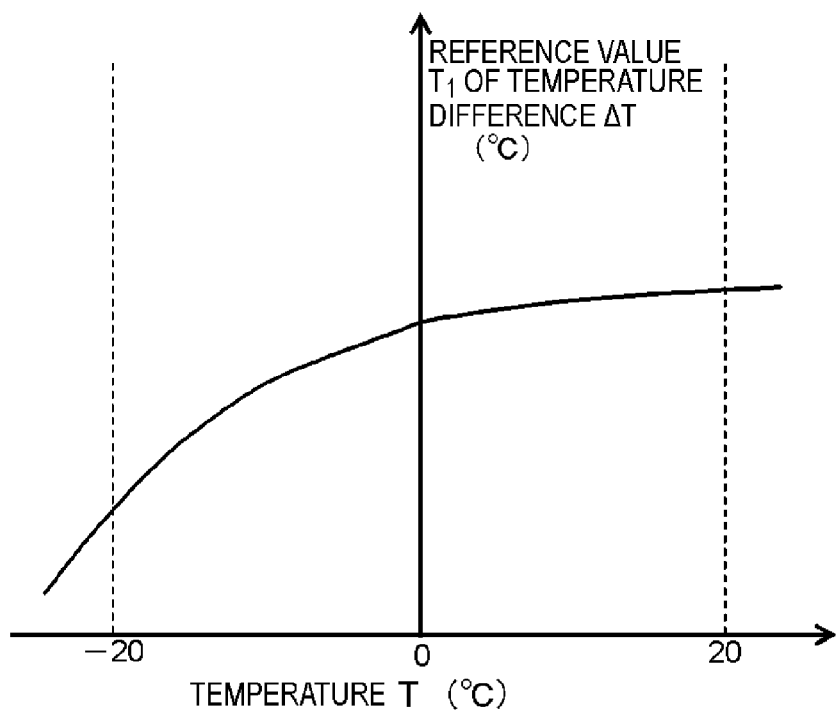

US 9,525,289 B2

BATTERY CONTROL SYSTEM AND BATTERY PACK

CROSS REFERENCE TO RELATED APPLICATIONS

This application is a National Stage of International Application No. PCT/JP2013/000709, filed Feb. 8, 2013, claiming priority from Japanese Patent Application No. 2012-044631, filed Feb. 29, 2012, the contents of all of which are incorporated herein by reference in their entirety.

TECHNICAL FIELD

The present invention relates to a battery control system and a battery pack.

BACKGROUND ART

Various charge and discharge methods and control circuits are proposed in order to stably obtain power from a battery pack.

Patent Document 1 (Japanese Unexamined Patent Publication No. 2009-232559) discloses a battery pack charge balance circuit as described below. Such a battery pack charge balance circuit includes a first balance control circuit, a second balance control circuit and a protection circuit. The first balance control circuit and the second balance control circuit are connected in series to each other between both charge and discharge terminals of a charge and discharge circuit. The first balance control circuit includes a control unit connected in parallel thereto, corresponding to a plurality of battery units. The second balance control circuit includes a first branch and a second branch which are connected in parallel to each other. Thereby, it is possible to perform a shunt on a battery unit reaching an unbalance protection startup voltage which is set in advance, and to prevent the protection circuit from starting up an overcharge protection function early. Therefore, it is possible to balance the charge of each of the battery units.

In addition, Patent Document 2 (Japanese Unexamined Patent Publication No. H09-322417) discloses a discharge method as described below. A temperature of each of a plurality of battery units is detected. An arithmetic operation of a discharge termination voltage is performed on the lowest temperature of the detected temperatures as a priority. When the lowest temperature drops, an arithmetic operation is performed so that the discharge termination voltage is corrected to be lower. When the voltage of each of the battery units is compared with the discharge termination voltage, and the voltage of any of the battery units becomes lower than the discharge termination voltage, the discharge of all the battery units is stopped. Thereby, it is possible to prevent over-discharge from occurring, and to prevent a residual capacity from running out quickly.

RELATED DOCUMENTS

Patent Documents

[Patent Document 1] Japanese Unexamined Patent Publication No. 2009-232559
[Patent Document 1] Japanese Unexamined Patent Publication No. H09-322417

DISCLOSURE OF THE INVENTION

The inventor has found that the following problem occurs in a battery pack having a plurality of battery units which are connected in series to each other. In battery units within a battery pack, a temperature difference occurs due to the arrangement of the battery units. In this case, even when residual capacities between each of the battery units are equal to each other, a voltage difference occurs between each of the battery units during electrification. In this case, when control for equalizing voltages between each of the battery units is performed, there is the possibility of the equal residual capacities varying inversely.

According to the present invention, there is provided a battery control system including: a temperature measurement unit that measures temperatures of two or more battery units of a plurality of battery units which are connected in series to each other; a voltage measurement unit that measures voltages of the battery units; an electrification detection unit that detects electrification of the battery units; and a battery control unit that controls charge and discharge of the battery units, wherein the battery control unit specifies a lowest temperature unit in which the temperature is lowest and a highest temperature unit in which the temperature is highest, on the basis of the temperatures measured by the temperature measurement unit, during the electrification of the battery units, further performs balance control for reducing a difference between the voltages of at least two battery units, on the basis of the voltages measured by the voltage measurement unit, when a first temperature condition in which a temperature difference between the highest temperature unit and the lowest temperature unit is equal to or greater than a reference value is not satisfied, and does not perform the balance control when the temperature difference satisfies the first temperature condition.

According to the present invention, there is provided a battery pack including: a plurality of battery units which are connected in series to each other; a temperature measurement unit that measures temperatures of the two or more battery units; a voltage measurement unit that measures voltages of the battery units; an electrification detection unit that detects electrification of the battery units; and a battery control unit that controls charge and discharge of the battery units, wherein the battery control unit specifies a lowest temperature unit in which the temperature is lowest and a highest temperature unit in which the temperature is highest, on the basis of the temperatures measured by the temperature measurement unit, during the electrification of the battery units, performs balance control for reducing a difference between the voltages of at least two battery units, on the basis of the voltages measured by the voltage measurement unit, when a first temperature condition in which a temperature difference between the highest temperature unit and the lowest temperature unit is equal to or greater than a reference value is not satisfied, and does not perform the balance control when the temperature difference satisfies the first temperature condition.

According to the present invention, the battery control unit performs the balance control for reducing the voltage difference between at least two battery units, on the basis of the voltages measured by the voltage measurement unit, when the first temperature condition in which the temperature difference between the highest temperature unit and the lowest temperature unit is equal to or greater than a reference value is not satisfied. On the other hand, when the temperature difference satisfies the first temperature condition, the battery control unit does not perform the balance control. Thereby, when the cause for the occurrence of the voltage difference between each of the battery units is a temperature difference between each of the battery units, it is possible for the balance control not to be performed. That is, when the residual capacities of the respective battery units are equal to each other, unnecessary balance control is not performed. Therefore, it is possible to stably charge or discharge the battery pack while appropriately determining the cause for the occurrence of the voltage difference between each of the battery units.

BRIEF DESCRIPTION OF THE DRAWINGS

The above-mentioned objects, other objects, features and advantages will be made clearer from the preferred embodiments described below, and the following accompanying drawings.

FIG. 6 is a diagram illustrating a control method according to the first embodiment.

DESCRIPTION OF EMBODIMENTS

Figure 1:
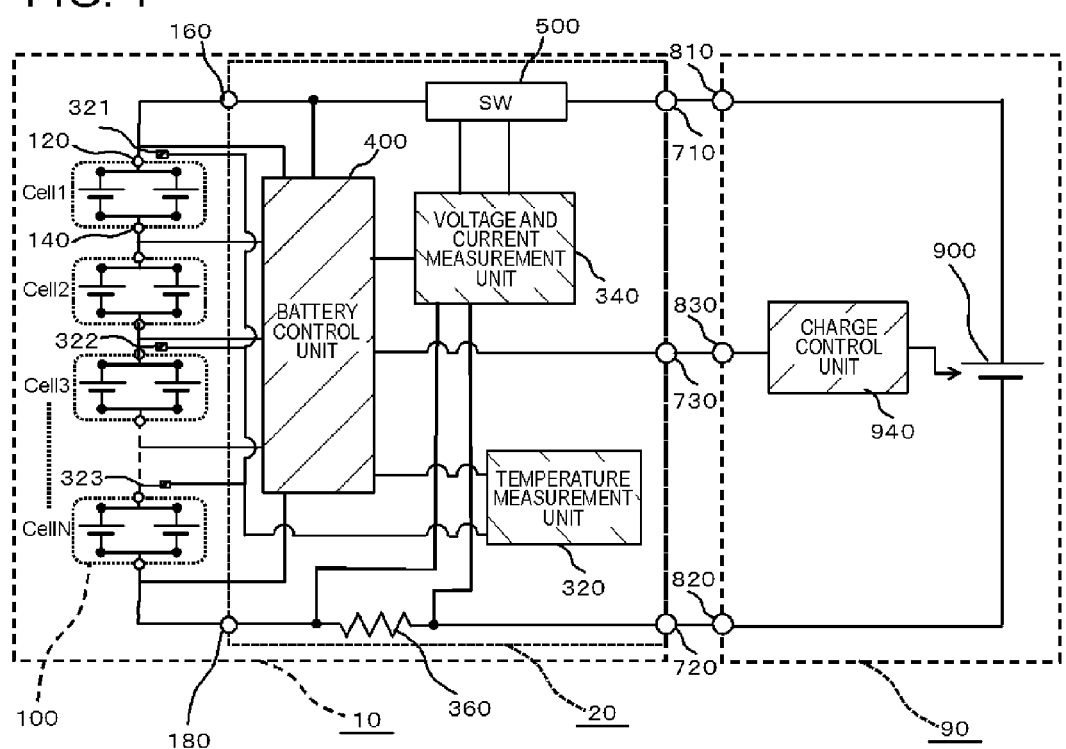
FIG. 1 is a circuit diagram illustrating a configuration of a battery pack according to a first embodiment.

Hereinafter, embodiments of the present invention will be described with reference to the accompanying drawings. In all the drawings, like elements are referenced by like reference numerals and descriptions thereof will not be repeated.

The term "battery pack 10" as used herein refers to an assembled battery having a plurality of battery units. In addition, the term "battery unit" refers to a unit having at least one or more battery cells 100. Further, the battery cell 100 included in the "battery unit" may include a plurality of single batteries having a positive electrode, a negative electrode and the like. In addition, a plurality of "battery units" may include a different quantity of the battery cells 100, respectively. In the following, a description will be given of a case where the "battery unit" included in the "battery pack 10" is the battery cell 100 having two single batteries which are connected in parallel to each other.

First Embodiment

The battery pack 10 according to a first embodiment will be described with reference to FIGS. 1 and 2. FIG. 1 is a circuit diagram illustrating a configuration of the battery pack 10 and an electronic device 60 according to the first embodiment. The battery pack 10 includes a plurality of battery cells 100, a temperature measurement unit (temperature measurement unit 320 and temperature sensor), a voltage measurement unit and an electrification detection unit (voltage and current measurement unit 340), and a battery control unit (battery control unit 400). Meanwhile, in the first embodiment, the voltage and current measurement unit 340 serves both as the voltage measurement unit and the electrification detection unit. The plurality of battery cells 100 are connected in series to each other. The temperature measurement unit 320 measures temperatures of two or more battery cells 100. The battery control unit 400 controls charge and discharge of the battery cell 100. In addition, the battery control unit 400 specifies a lowest temperature cell having the lowest temperature and a highest temperature cell having the highest temperature on the basis of the temperatures measured by the temperature measurement unit 320, during the electrification of the battery cells 100. In addition, when a first temperature condition in which a temperature difference $\Delta T$ between the highest temperature cell and the lowest temperature cell is equal to or greater than a reference value $T_1$ is not satisfied, the battery control unit 400 performs balance control for reducing a difference between the voltages of at least two battery cells 100, on the basis of the voltages measured by the voltage and current measurement unit 340. On the other hand, when the temperature difference $\Delta T$ satisfies the first temperature condition, the battery control unit 400 does not perform the balance control. Hereinafter, a detailed description will be given.

As shown in FIG. 1, the battery pack 10 includes a plurality of battery cells 100. Here, the battery pack 10 includes, for example, N battery cells 100. In addition, as described above, the battery cell 100 has two single batteries. Specifically, the battery cell 100 is a Li-ion secondary battery. In the battery pack 10 according to the first embodiment, the plurality of battery cells 100 are received in exterior bodies (not shown), respectively, and are packaged in the battery pack 10 in a state where the battery cells are placed in a row. Meanwhile, the package aspect of the battery cell 100 may be formed in an arbitrary manner, and may be formed, for example, in a state where the plurality of battery cells 100 are laminated in a row in the thickness direction thereof, or in a state where the laminated battery cells 100 are disposed adjacent to a plurality of rows. In such a package or the like, it is also possible to obtain the same effect as that in the first embodiment.

Here, in order to simplify the description, it is assumed that the full charge capacities of the respective battery cells 100 in the first embodiment are equal to each other. Even in such a battery pack 10, a difference between respective internal resistances may occur between each of the battery cells 100 due to a temperature difference. In this case, during the electrification of the battery pack 10, there is the possibility of a voltage difference occurring between each of the battery cells 100 due to a difference between voltage drops of the internal resistances. The first embodiment is particularly effective in such a case. Meanwhile, in principle, even when the full charge capacities of the respective battery cells 100 are different from each other, the same effect can be obtained.

The battery pack 10 in the first embodiment includes a control circuit 20 in addition to the battery cells 100. The control circuit 20 includes a voltage and current measurement unit 340, a temperature measurement unit 320, a battery control unit 400 and a switch 500.

In addition, the control circuit 20 is connected to the battery cells 100 which are connected in series to each other. The control circuit 20 includes an internal positive electrode terminal 160, an internal negative electrode terminal 180, an external positive electrode terminal 710 and an external negative electrode terminal 720. The internal positive electrode terminal 160 is connected to a positive electrode terminal 120 of one battery cell 100 connected in series. In addition, the internal negative electrode terminal 180 is connected to a negative electrode terminal 140 of another battery cell 100 connected in series.

The internal positive electrode terminal 160 is connected to the external positive electrode terminal 710 for connection to an external device using the battery pack 10 through an interconnect (not shown) and the switch 500 within the control circuit 20. In addition, the internal negative electrode terminal 180 is also connected to the external negative electrode terminal 720 similarly.

The switch 500 for stopping charge or discharge is provided between the internal positive electrode terminal 160 and the external positive electrode terminal 710. The switch 500 is provided between, for example, the internal positive electrode terminal 160 on the battery cell 100 side and the external positive electrode terminal 710. In this case, the switch 500 is, for example, a P-channel metal oxide semiconductor field effect transistor (MOSFET). Two P-channel MOSFETs are provided within the switch 500. Thereby, one MOSFET is used for controlling charge. On the other hand, the other MOSFET is used for controlling discharge. In addition, each MOSFET in the switch 500 is connected to the voltage and current measurement unit 340.

Meanwhile, when the switch 500 is an N-channel MOSFET, the switch 500 is disposed between the internal negative electrode terminal 180 and the external negative electrode terminal 720. Besides, the switch 500 may be, for example, an insulated gate bipolar transistor (IGBT), a relay or a breaker.

The control circuit 20 is provided with the temperature measurement unit 320. The temperature measurement unit 320 measures the temperatures of two or more battery cells 100. The temperature measurement unit 300 includes at least two or more temperature sensors (321, 322, and 323). The temperature sensor is, for example, a thermocouple.

The temperature sensors of the temperature measurement unit 320 are provided, for example, so as to measure the temperatures of at least one battery cell 100 which is disposed at the outermost side and a battery cell 100 which is located further inside than the at least one battery cell 100. The battery cell 100 which is disposed at the outermost side in the battery cells 100 within the battery pack 10 is not likely to warm up. On the other hand, the battery cell 100 disposed inside the battery pack 10 has a tendency to warm up. For this reason, when the generation of heat from the battery pack 10 is dominant, for example, the temperature sensors are arranged as described above, and thus it is possible to measure the temperatures of two battery cells 100 having a largest temperature difference. Meanwhile, when thermal energy is supplied from the outside of the battery pack 10, the arrangement of the temperature sensors may be appropriately changed. Specifically, in a household storage battery disposed outdoors, there may be a case where the battery pack 10 is irradiated with sunlight. In this case, the battery cell 100 on which the sunlight shines and the battery cell 100 located in the shadow of the sunlight may be provided with the temperature sensors.

Here, the temperature sensor 321, the temperature sensor 322 and the temperature sensor 323 are respectively provided so as to come into contact with different battery cells 100. Among them, the temperature sensor 321 is provided so as to come into contact with the battery cell 100 (Cell 1 in the drawing) which is disposed at the outermost side. In addition, the temperature sensor 322 is provided so as to come into contact with the battery cell 100 (Cell 3 in the drawing) located near the center of the battery pack 10. In addition, the temperature sensor 323 is provided so as to come into contact with the battery cell 100 (Cell N in the drawing) which is disposed at the outside on the opposite side to the temperature sensor 321. Meanwhile, each of the temperature sensors is attached to an exterior body (not shown) that receives the battery cells 100. Meanwhile, the temperature sensor may be attached to, for example, the battery cell 100 in the exterior body.

In addition, the temperature sensor may be provided near the outside of the battery pack 10. Thereby, the temperature measurement unit 320 can measure the temperature of outside air.

In addition, the temperature measurement unit 320 receives a signal such as a thermo-electromotive force occurring in the above-mentioned temperature sensor to calculate a temperature. The temperature measurement unit 320 is connected to the battery control unit 400. Thereby, the battery control unit 400 receives a signal of the temperature measured by the temperature measurement unit 320. Meanwhile, the battery control unit 400 may receive a signal of the temperature sensor to calculate a temperature.

In addition, the control circuit 20 is provided with the voltage and current measurement unit 340. The voltage and current measurement unit 340 is connected to the battery cells 100 through the battery control unit 400. The voltage and current measurement unit 340 measures the voltage of each of the plurality of battery cells 100. In addition, the voltage and current measurement unit 340 may measure a voltage between both ends of the internal positive electrode terminal 160 and the internal negative electrode terminal 180 in order to measure the total voltage of the plurality of battery cells 100 which are connected in series to each other.

In addition, a resistor 360 of which the resistance value is known is provided between the internal negative electrode terminal 180 and the external negative electrode terminal 720. The voltage and current measurement unit 340 is connected to both ends of the resistor 360. By measuring a voltage value applied to the resistor 360, the voltage and current measurement unit 340 calculates a value divided by the above resistance value as a value of a current flowing through the battery cell 100. When the absolute value of the voltage value is larger than a predetermined reference value, the battery control unit 400 can determine that the battery cell 100 is being electrified (charge or discharge is performed).

The control circuit 20 is provided with the battery control unit 400. The battery control unit 400 is connected to each of the battery cells 100 through an interconnect (no sign shown).

The battery control unit 400 is connected to the temperature measurement unit 320 and the voltage and current measurement unit 340. The battery control unit 400 control the charge and discharge of each of the battery cells 100 on the basis of the temperatures measured by the temperature measurement unit 320 and the voltages measured by the voltage and current measurement unit 340. The battery control unit 400 includes an arithmetic operation unit (not shown) that performs an arithmetic operation process on the basis of the temperatures and the voltages mentioned above. For example, the battery control unit 400 specifies the lowest temperature cell having the lowest temperature and the highest temperature cell having the highest temperature from the battery cells 100 provided with the temperature sensors, on the basis of the temperatures measured by the temperature measurement unit 320.

In addition, the battery control unit 400 includes a communication unit (not shown) for transmitting a signal from the battery control unit 400 to the electronic device 60 or receiving a signal from the electronic device 60. The battery control unit 400 is connected to a communication terminal 730 for transmitting and receiving a signal to and from the electronic device 60.

In addition, the voltage and current measurement unit 340, the battery control unit 400 and the switch 500 improve safety and the cycle life of charge and discharge, and thus function as protection circuits. When the battery cell 100 is discharged down to an over-discharge detection voltage value or lower, the voltage and current measurement unit 340, the battery control unit 400 and the switch 500 terminate the discharge forcibly. On the other hand, when the battery cell is charged up to an over-charge detection voltage value or higher, the charge is terminated forcibly.

Besides, the battery control unit 400 includes a storage unit (not shown) that stores the reference value $T_1$ of the temperature difference $\Delta T$, and the like.

In this manner, in the first embodiment, the battery pack 10 including the plurality of battery cells 100 and control circuit 20 is packaged.

In the first embodiment, a case in which the battery pack 10 is charged will be described. In this case, the battery pack 10 is connected to, for example, a charger 90. The charger 90 includes a power supply source 900. The power supply source 900 as used herein refers to a power source for charging the battery pack 10. The positive electrode terminal 810 and the negative electrode terminal 820 of the charger 90 are connected to the power supply source 900. Meanwhile, when the power supply source 900 is an alternating current, the charger 90 may include a converter unit (not shown) that converts an alternating current into a direct current.

The positive electrode terminal 810 and the negative electrode terminal 820 are provided on the battery pack 10 side of the charger 90. The positive electrode terminal 810 and the negative electrode terminal 820 of the charger 90 are respectively connected to the external positive electrode terminal 710 and the external negative electrode terminal 720 of the battery pack 10. Thereby, the charger 90 can charge the battery pack 10.

A charge control unit 940 is connected to the power supply source 900. Thereby, the charge control unit 940 controls the voltage and current of the power supply source 900.

In addition, the charge control unit 940 may be connected to a communication terminal 830. A communication terminal 830 on the charger 90 side is connected to the communication terminal 730 on the battery pack 10 side, for example, through an interconnect (not shown). Thereby, the charge control unit 940 which is connected to the battery control unit 400 can receive various types of signals.

Here, an equivalent circuit in the vicinity of the battery cells 100 will be described with reference to FIG. 2. FIG. 2 shows an example of the equivalent circuit of a portion that controls the charge and discharge of the battery cells 100 in the battery control unit 400. A dotted line in the drawing shows the inside of the battery control unit 400. Meanwhile, an interconnect for transferring a control signal, and the like are omitted.

Figure 2:
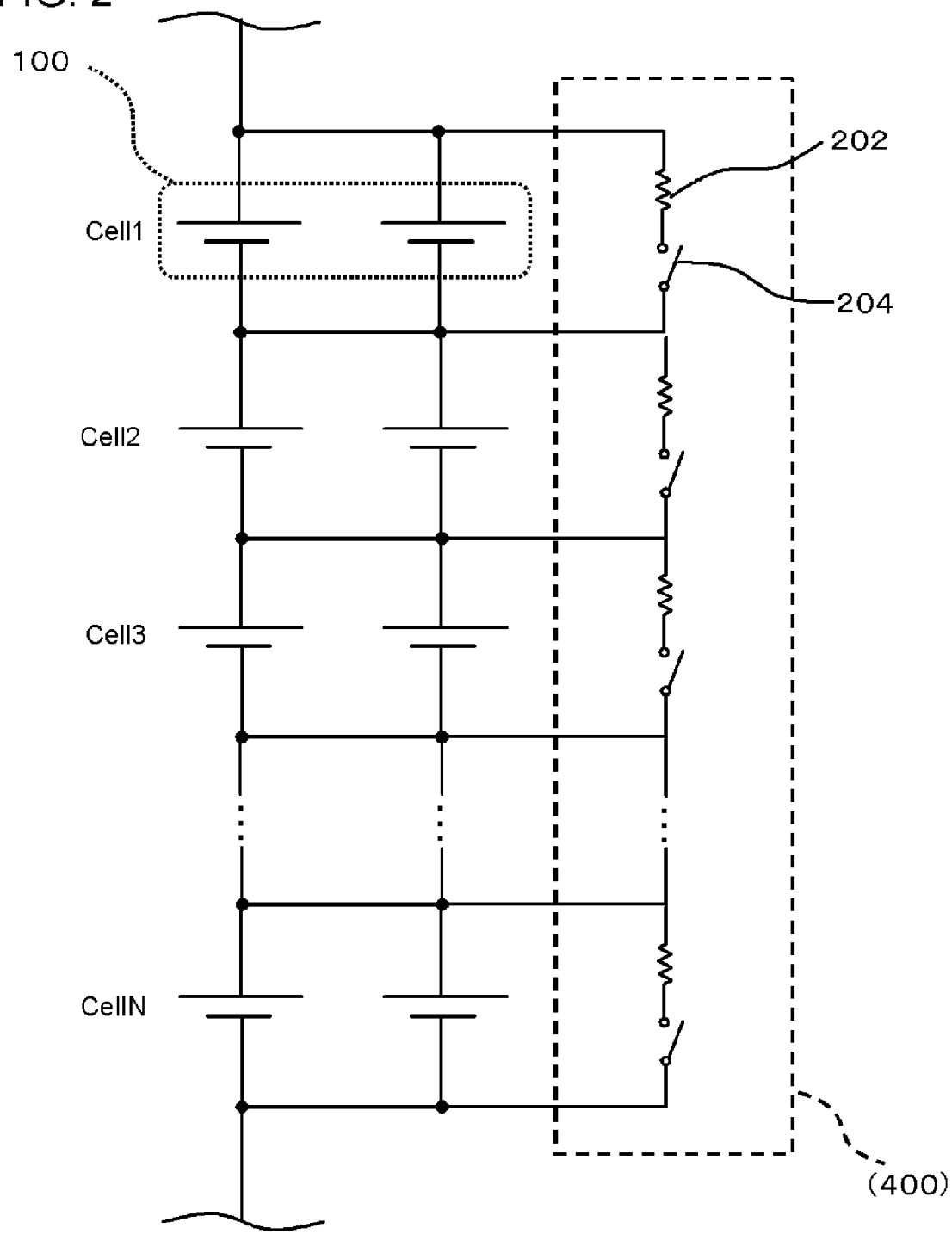
FIG. 2 is an equivalent circuit diagram in the vicinity of battery cells of the battery pack according to the first embodiment.

As shown in FIG. 2, the battery control unit 400 includes, for example, the following configuration. The battery control unit 400 is connected to each of the battery cells 100 through an interconnect (no sign shown). In the battery control unit 400, an internal resistor 202 and a first cell switch 204 are disposed in parallel with each of the battery cells 100.

When a voltage difference occurs between each of the battery cells 100, the battery control unit 400 performs balance control for equalizing the voltages of the battery cells 100 in which the voltage difference occurs, on the basis of the voltages measured by the voltage and current measurement unit 340.

Here, the battery control unit 400 can perform control as follows, for example, in the "balance control". When a voltage difference ($\Delta V$) between a maximum voltage cell having the highest voltage and a minimum voltage cell having the lowest voltage is equal to or greater than a first reference voltage value ($V_1$), control is performed so that the voltage difference decreases on the basis of the voltages measured by the voltage and current measurement unit 340. Here, the battery control unit 400 performs, for example, control for suppressing a rise in the voltage of the maximum voltage cell. In the first embodiment, when the temperature difference between the highest temperature cell and the lowest temperature cell is less than the reference value (first temperature condition is not satisfied), and the voltage difference is equal to or greater than a first reference value, the above-mentioned balance control is performed. Thereby, the voltage difference between the maximum voltage cell and the minimum voltage cell is not caused by the temperature difference, and thus it is possible to equalize the voltages of all the battery cells 100.

Specifically, the battery control unit 400 includes, for example, the equivalent circuit of FIG. 2, and the balance control is performed in the following procedure. First, the battery control unit 400 turns on the first cell switch 204 which is disposed in parallel with the battery cell 100 corresponding to the maximum voltage cell. On the other hand, the first cell switches 204 which are disposed in parallel with other battery cells 100 are set to be in an open state. By turning on the first cell switch 204 which is disposed in parallel with the maximum voltage cell, a charge current flowing into the maximum voltage cell is shunted to the internal resistor 202 which is connected in series to the first cell switch 204. Thereby, the charge current flowing into the maximum voltage cell is reduced in accordance with a voltage which is presently applied to the maximum voltage cell, an internal resistance of the maximum voltage cell, and a value of the internal resistor 202 of the battery control unit 400. Therefore, the battery control unit 400 can suppress an increase in the voltage of the maximum voltage cell.

On the other hand, other battery cells 100 other than the maximum voltage cell are continued to be charged. Thereby, the voltage of the maximum voltage cell comes close to the voltages of other battery cells 100. After elapse of a predetermined period, the battery control unit 400 turns off the first cell switch 204. In this manner, when the temperature difference between the highest temperature cell and the lowest temperature cell is less than the reference value (first temperature condition is not satisfied), the battery control unit 400 can equalize the voltages of the battery cells 100 by performing the balance control.

Meanwhile, in the above-mentioned "balance control", although the charge current flowing through the maximum voltage cell is shunted to the internal resistor 202, the maximum voltage cell is changed to discharge to reduce the capacity of the maximum voltage cell, and thus the voltage difference between the battery cells 100 may be reduced. In this case, the resistance value of the internal resistor 202 is set in advance depending on the range of the voltage, internal resistance or charge current of the battery cell 100. Thereby, the battery cell 100 can be changed to discharge during the balance control.

Meanwhile, the equivalent circuit shown in FIG. 2 is a simple structure formed of only the internal resistor 202 and the first cell switch 204. Thereby, the battery control unit 400 can be received in a small region within the battery pack 10. In addition, the circuit of the battery control unit 400 can be formed at low cost.

In the first embodiment, the battery control unit 400 performs the above-mentioned balance control when the first temperature condition in which the temperature difference ΔT between the highest temperature cell and the lowest temperature cell is equal to or greater than the reference value $T_1$ is not satisfied. On the other hand, when the temperature difference ΔT satisfies the first temperature condition, the battery control unit 400 does not perform the balance control. Meanwhile, the details of such a control method will be described later.

Figure 3:
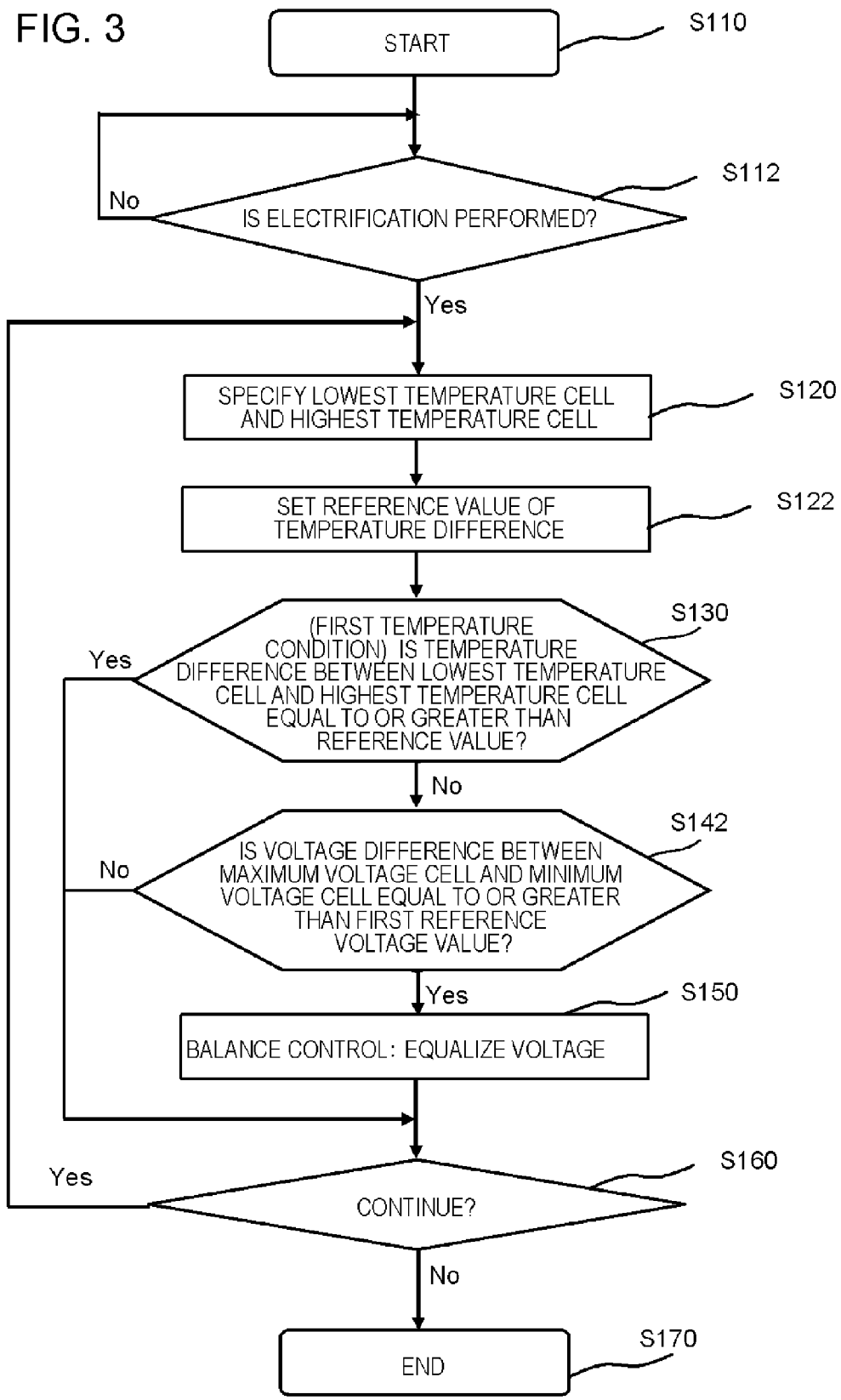
FIG. 3 is a flow diagram illustrating a control method according to the first embodiment.
Figure 4:
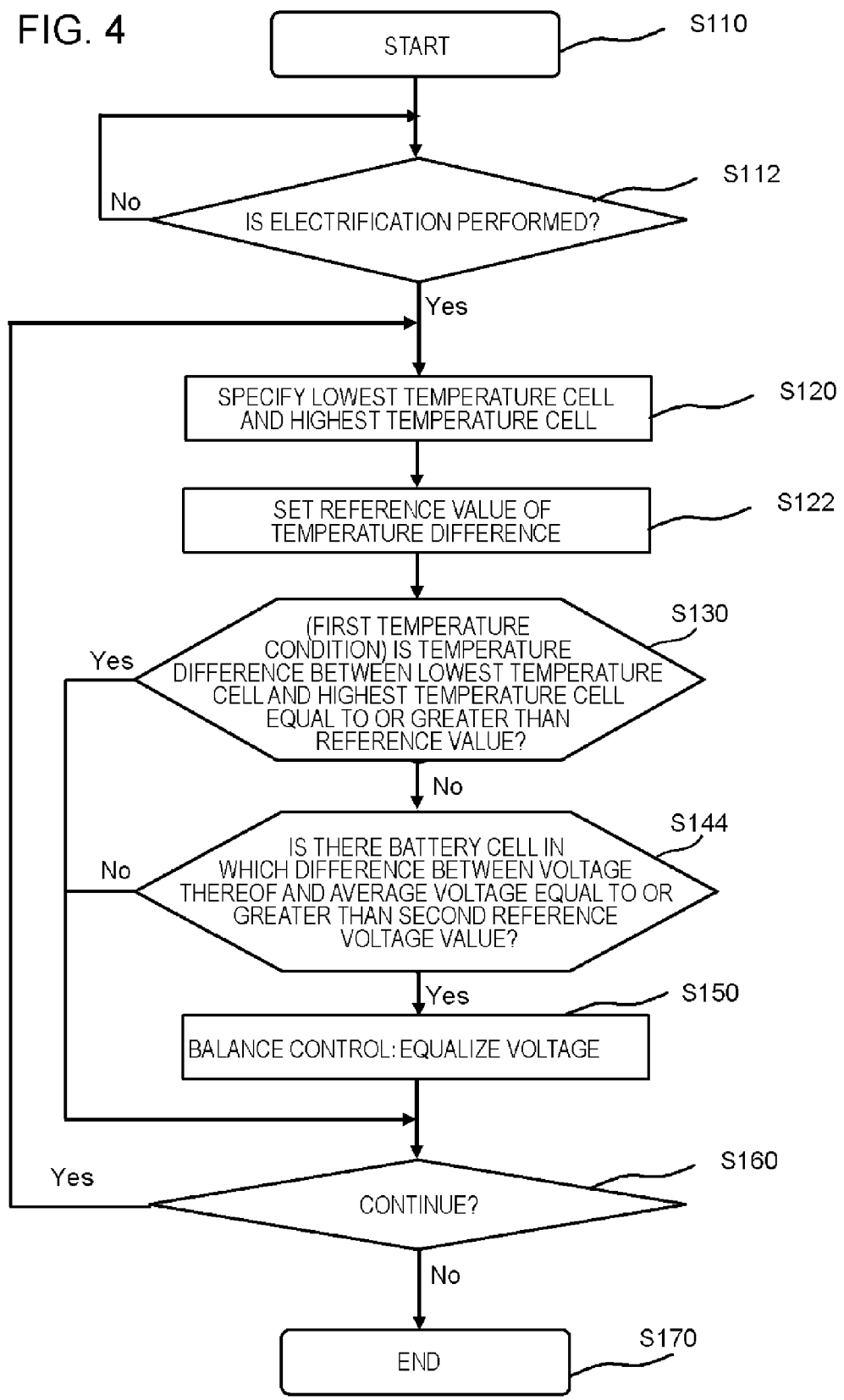
FIG. 4 is a modified example of the flow diagram illustrating a control method according to the first embodiment.
Figure 5:
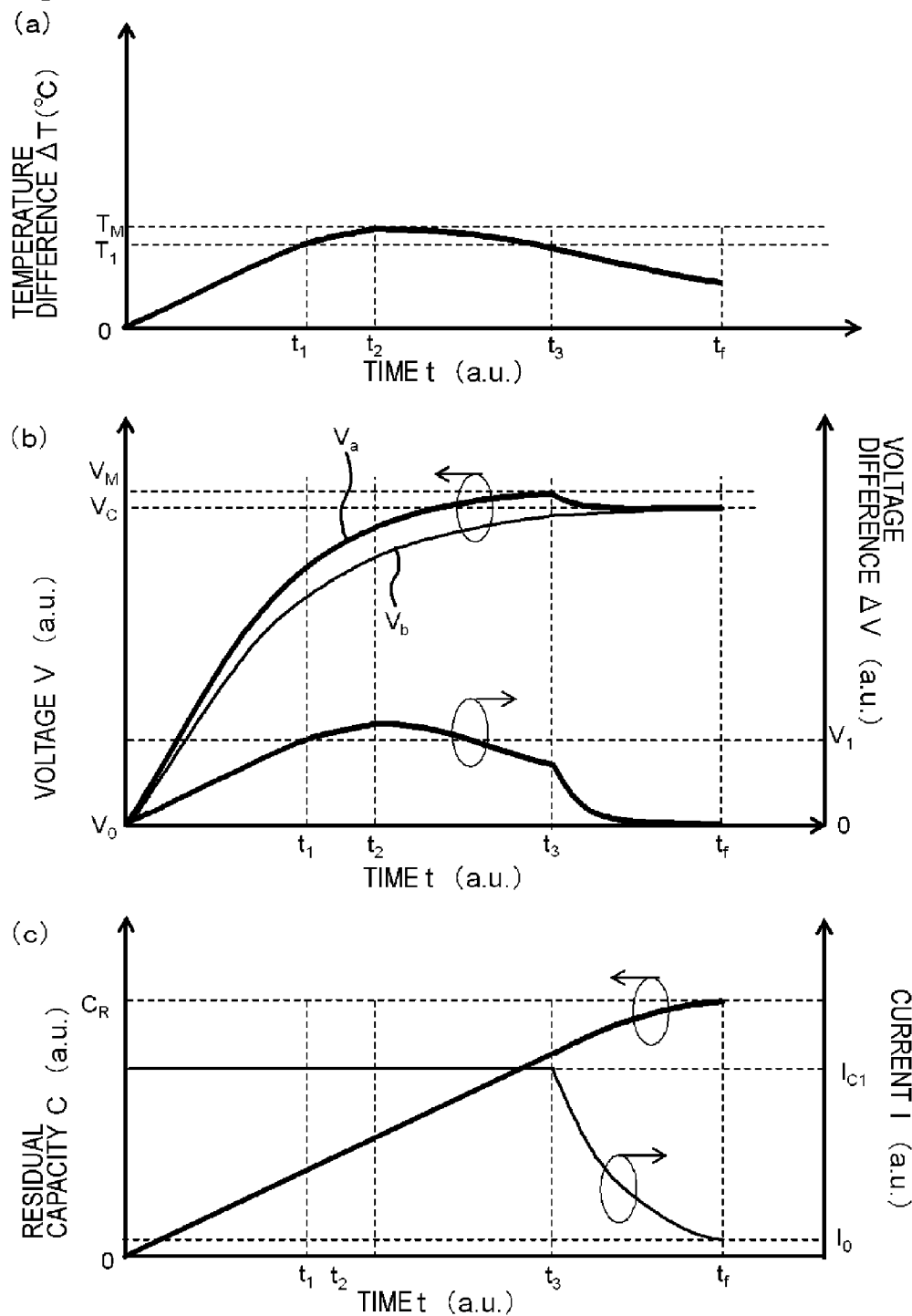
FIG. 5 is a diagram illustrating a control method according to the first embodiment.
Figure 7:
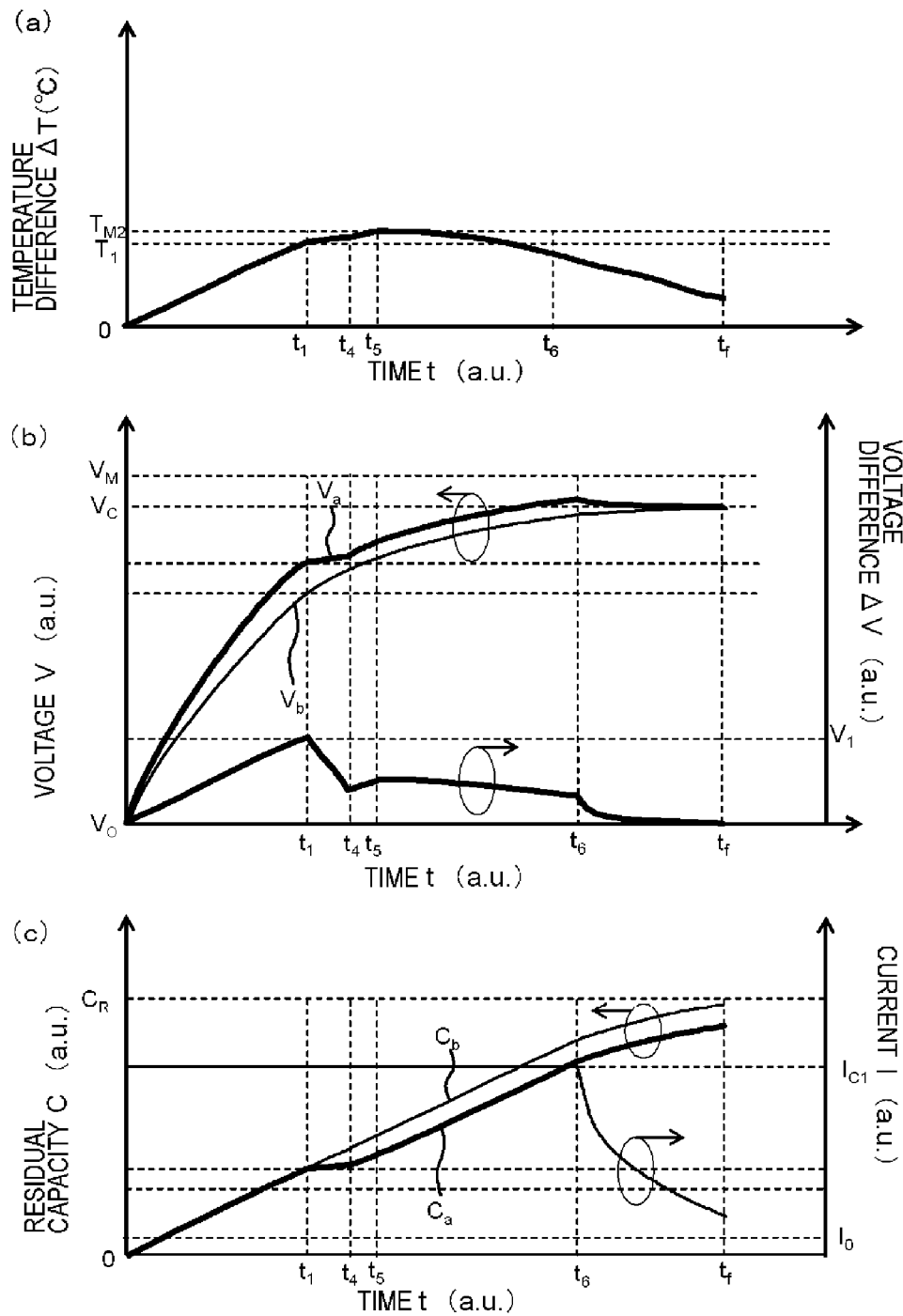
FIG. 7 is a diagram illustrating a comparative example for describing an effect of the first embodiment.

Next, a method of controlling the battery pack 10 stated above will be described with reference to FIGS. 3 to 7. FIG. 3 is a flow diagram illustrating a control method according to the first embodiment. FIG. 4 is a modified example of a flow diagram for describing the control method according to the first embodiment. FIGS. 5 to 7 are diagrams illustrating the control method according to the first embodiment. The control method according to the first embodiment includes the following steps. First, the battery control unit 400 determines whether electrification is performed on the basis of the current measured by the voltage and current measurement unit 340 (S112). When the electrification is performed (S112; Yes), the battery control unit 400 specifies the lowest temperature cell having the lowest temperature and the highest temperature cell having the highest temperature on the basis of the temperatures measured by the temperature measurement unit 320 (S120). Next, the battery control unit 400 determines the first temperature condition in which the temperature difference ΔT between the highest temperature cell and the lowest temperature cell is equal to or greater than the reference value $T_1$ (S130). Next, when the first temperature condition in which the temperature difference ΔT between the highest temperature cell and the lowest temperature cell is equal to or greater than the reference value $T_1$ is not satisfied (S130; No), the battery control unit 400 performs the balance control for reducing a difference in voltage between at least two battery cells 100, on the basis of the voltage measured by the voltage and current measurement unit 340. On the other hand, when the temperature difference ΔT satisfies the first temperature condition (S130; Yes), the battery control unit 400 does not perform the balance control. Hereinafter, a detailed description will be given.

Here, a case where the battery pack 10 is charged will be described. It is assumed that the full charge capacities of the respective battery cells 100 are equal to each other. In addition, it is assumed that there is no residual capacity of all the battery cells 100 of the battery pack 10. The voltages of all the battery cells 100 in an initial step become a value close to a discharge termination voltage $V_0$.

Here, this charge is performed by a constant-current and constant-voltage charging method. The "constant-current and constant-voltage charging method" as used herein refers to a charge method in which the charge is performed with a constant charge current until the voltage of the entire battery pack 10 reached a specific charge voltage, and an applied voltage is fixed to the charge voltage after reaching the specific charge voltage. Here, for example, the above "charge voltage" is set to $NV_C$ so that the voltage of the battery cell 100 is set to a charge reference voltage value $V_C$. In addition, the "charge current" is set to $I_{C1}$.

First, in FIG. 3, charge is started (S110). Specifically, the external positive electrode terminal 710 and the external negative electrode terminal 720 of the battery pack 10 are respectively connected to the positive electrode terminal 810 and the negative electrode terminal 820 of the charger 90. Thereby, the charge of the plurality of battery cells 100 is started. At the same time, the temperature measurement unit 320 starts to measure the temperature of the battery cell 100 provided with the temperature sensor. In addition, the voltage and current measurement unit 340 starts to measure the voltage of each of the battery cells 100 (S110).

Next, the battery control unit 400 determines whether electrification is performed on the basis of the current measured by the voltage and current measurement unit 340 (S112). Specifically, the battery control unit 400 determines whether the current is greater than 0 on the basis of the current measured by the voltage and current measurement unit 340. Here, since the charge of the battery pack 10 is performed, the current is greater than 0 (S112; Yes).

Next, when electrification is performed (S112; Yes), the battery control unit 400 specifies the lowest temperature cell having the lowest temperature and the highest temperature cell having the highest temperature on the basis of the temperatures measured by the temperature measurement unit 320 (S120). Here, for example, the battery cell 100 (Cell 1 in FIG. 1) which is disposed at the outermost side has a tendency of allowing heat to escape, and thus becomes the lowest temperature cell. On the other hand, the battery cell 100 (Cell 3 in FIG. 1) located near the center of the battery pack 10 is not likely to cause heat to escape, and thus becomes the highest temperature cell.

Here, when the battery cell 100 is electrified, Joule heat is emitted due to the internal resistance of the battery cell 100 or the like. In principle, the temperature of each of the battery cells 100 rises due to the Joule heat. However, it is not always true that the temperature of each of the battery cells 100 rises equally due to the factors of the position of the battery cell 100, the usage environment of the electronic device 60 such as the temperature of outside air, the specific heat of the battery cell 100 itself, the package aspect of the battery pack 10, the dissipation of heat to the outside, the current of the charger 90, and the like.

FIG. 5(*a*) shows a relationship between the time from the charge start time, and the temperature difference ΔT between the highest temperature cell and the lowest temperature cell in the first embodiment. Among the battery cells 100, the highest temperature cell is provided inside the battery pack 10 as described above. For this reason, in the initial step of the charge, a rise in the temperature of the highest temperature cell is fast. On the other hand, the lowest temperature cell is disposed at the outermost side as described above. For this reason, a rise in the temperature of the lowest temperature cell is slow.

Therefore, as shown in FIG. 5(a), in the initial step of the charge at earlier than time $t_1$, the temperature difference $\Delta T$ between the highest temperature cell and the lowest temperature cell increases monotonically. Meanwhile, in the initial step, when the temperature difference is small, and it is difficult to specify the highest temperature cell and the lowest temperature cell, the highest temperature cell and the lowest temperature cell may be updated at any time.

In addition, FIG. 5(b) shows a relationship between the time from the charge start time, and the voltage $V_a$ of the battery cell 100 having the highest voltage and the voltage $V_b$ of the battery cell 100 having the lowest voltage among the battery cells 100, in the first embodiment. Meanwhile, the voltage $V_a$ of the battery cell 100 (maximum voltage cell) having the highest voltage is shown by thick solid lines, and the voltage $V_b$ of the battery cell 100 (minimum voltage cell) having the lowest voltage is shown by thin solid lines. In addition, the drawing shows a relationship between the time from the charge start time, and the voltage difference $\Delta V$ between the maximum voltage cell and the lowest temperature cell in the first embodiment.

In addition, FIG. 5(c) shows a relationship between the time from the charge start time and the residual capacity of the battery cell 100 in the first embodiment, and a relationship between the time from the charge start time and the current of the battery cell 100 in the first embodiment.

In FIG. 5(c), the charge until time $t_1$ is constant current charge. In addition, all the battery cells 100 are connected in series to each other. Therefore, the current of all the battery cells 100 is kept constant at the constant current value $I_{C1}$.

Here, the battery cell 100 has an internal resistance. For this reason, when the battery cell 100 is electrified, a total voltage with which the product of the internal resistance and the current value is superimposed is applied to the battery cell 100, in addition to a voltage equivalent to the residual capacity of the battery cell 100.

FIG. 6(a) shows a relationship between the temperature of the battery cell 100 and the internal resistance of the battery cell 100. As the temperature in the battery cell 100 becomes lower, the internal resistance of the battery cell 100 increases. Particularly, as the temperature becomes lower, the internal resistance has a tendency to increase significantly. For this reason, the internal resistance of the lowest temperature cell is larger than the internal resistance of the highest temperature cell.

As shown in FIG. 5(b), from the charge start, a difference in voltage occurs due to a difference in internal resistance. Here, as described above, when the characteristics such as the full charge capacity of all the battery cells 100 are assumed to be equal to each other, the lowest temperature cell having a largest internal resistance becomes the battery cell 100 having the highest voltage. On the other hand, the highest temperature cell having a smallest internal resistance becomes the battery cell 100 having the lowest voltage.

In addition, in the initial step of the charge at earlier than time $t_1$, the voltage of the lowest temperature cell rises faster than the average voltage $V_b$ of the battery cell 100 due to a difference in internal resistance. The difference $(V_a-V_b)$ is equal to a value obtained by multiplying the difference in internal resistance by $I_{C1}$. In addition, while the above-mentioned temperature difference $\Delta T$ increases, a difference between the voltage $V_a$ of the lowest temperature cell and the average voltage $V_b$ increases.

Next, the battery control unit 400 sets the "reference value $T_1$ of the temperature difference $\Delta T$" (S122). As described later, the "reference value T1 of the temperature difference $\Delta T$" as used herein refers to a threshold of the temperature difference $\Delta T$ for determining whether the balance control is performed. In other words, the "reference value T1 of the temperature difference $\Delta T$" is a threshold for determining that the cause for the occurrence of the voltage difference between each of the battery cells 100 is the temperature difference between each of the battery cells 100. Meanwhile, the "reference value $T_1$ of the temperature difference $\Delta T$" may be set in advance. In that case, this step can be omitted.

Here, as shown in FIG. 6(a), the internal resistance of the battery cell 100 has a tendency to increase drastically as the temperature becomes lower. For this reason, a rise in the voltage of the lowest temperature cell becomes faster than a rise in the voltages of other battery cells 100 by a voltage component proportional to the internal resistance. Therefore, as the temperature of the battery cell 100 becomes lower, a difference in voltage between each of the battery cells 100 has a tendency to increase drastically due to a slight temperature difference between the battery cells 100.

Consequently, the battery control unit 400 changes the "reference value $T_1$ of the temperature difference $\Delta T$" in the first temperature condition on the basis of the temperature of the battery cells 100. The "reference value $T_1$ of the temperature difference $\Delta T$" is set to a dramatically smaller value, for example, as the temperature of the lowest temperature cell or the highest temperature cell becomes lower.

That is, for example, the battery control unit 400 may change the "reference value $T_1$ of the temperature difference $\Delta T$" for the temperature T of the battery cell 100 as shown in FIG. 6(b). Meanwhile, FIG. 6(b) shows a relationship between the temperature in the battery cell 100 and the "reference value $T_1$ of the temperature difference $\Delta T$". When the temperature of the battery cell 100 is low, the "reference value $T_1$ of the temperature difference $\Delta T$" is set to be lower in this manner, and thus the cause of the voltage difference between each of the battery cells 100 occurring due to a slight temperature difference between the battery cells 100 can be determined to be a temperature difference between each of the battery cells 100. Here, for example, the "reference value $T_1$ of the temperature difference $\Delta T$" is set from FIG. 6(b) on the basis of the temperature of the lowest temperature cell. Meanwhile, the reference value $T_1$ of the temperature difference $\Delta T$ may be set in advance, and be stored in the storage unit.

Meanwhile, the "reference value $T_1$ of the temperature difference $\Delta T$" for the temperature of the battery cell 100 is stored in the storage unit of the battery control unit 400 as a table form or a function.

In addition, the battery control unit 400 may change the table or the function in accordance with the environment in which the battery pack 10 is charged, or the like.

Next, the battery control unit 400 determines the first temperature condition in which the temperature difference $\Delta T$ between the highest temperature cell and the lowest temperature cell is equal to or greater than the reference value $T_1$ (S130).

When the first temperature condition in which the temperature difference $\Delta T$ between the highest temperature cell and the lowest temperature cell is equal to or greater than the reference value $T_1$ is not satisfied (S130; No), the battery control unit 400 determines whether a difference in voltage between the maximum voltage cell having the highest voltage and the minimum voltage cell having the lowest voltage is equal to or greater than the first reference voltage value on the basis of the voltage measured by the voltage and current measurement unit 340 (S142).

When the temperature difference $\Delta T$ does not satisfy the first temperature condition, and the voltage difference $\Delta V$ between the maximum voltage cell and the minimum voltage cell is less than the first reference voltage value $V_1$(S142; No), the battery control unit 400 determines whether the charge is continued as it is (S160). In this manner, when the voltage difference is small, it is possible for the balance control not to be performed.

On the other hand, when the temperature difference $\Delta T$ does not satisfy the first temperature condition, and the voltage difference $\Delta V$ between the maximum voltage cell having the highest voltage and the minimum voltage cell having the lowest voltage is equal to or greater than the first reference voltage value $V_1$ (S142; Yes), the balance control for reducing a difference between the voltages of at least two battery cells 100 is performed on the basis of the voltages measured by the voltage and current measurement unit 340 (S150). In this case, since the temperature difference caused by the voltage difference between the maximum voltage cell and the minimum voltage cell is small, it is possible to equalize the capacities of the battery cells 100 by performing the balance control.

Here, in FIG. 5(a), at earlier than time $t_1$, the temperature difference $\Delta T$ does not satisfy the first temperature condition (S130; No).

In addition, as shown in FIG. 5(b), a difference between the voltage $V_a$ of the maximum voltage cell and the voltage $V_b$ of the minimum voltage cell is small and is equal to or less than the first reference voltage value $V_1$(S142; No). Additionally, since the battery cell 100 is not fully-charged yet, the battery control unit 400 continues the charge as it is (S160; Yes).

At less than time $t_1$, in this manner, the charge is performed while repeating S120 to S160. Meanwhile, when the lowest temperature cell and the highest temperature cell are changed to different battery cells 100, these temperature cells may be updated to new battery cells 100 at any time.

Next, in FIG. 5(a), at time $t_1$, the temperature difference $\Delta T$ between the highest temperature cell and the lowest temperature cell is set to the reference value $T_1$. Therefore, the temperature difference $\Delta T$ satisfies the first temperature condition (S130; Yes).

Since the battery cell 100 is not fully-charged yet, the battery control unit 400 continues the charge, as it is, at time $t_1$ (S160; Yes).

Meanwhile, in FIG. 5(b), at time $t_1$, the voltage difference $\Delta V$ between the voltage $V_a$ of the maximum voltage cell and the voltage $V_b$ of the minimum voltage cell becomes equal to or greater than the first reference voltage value $V_1$. However, the temperature difference $\Delta T$ between the highest temperature cell and the lowest temperature cell is equal to or greater than the reference value $T_1$, and the first temperature condition is satisfied (S130; Yes). Therefore, the battery control unit 400 continues the charge even after time $t_1$ while repeating S120 to S160.

That is, as shown in FIG. 5(c), even after time $t_1$, the current is maintained constant at the current value $I_{C1}$.

After time $t_1$, when the charge is continued as it is, an increase in temperature difference $\Delta T$ becomes gentle as shown in FIG. 5(a). Next, the temperature difference $\Delta T$ becomes a maximum value $T_M$, and then the temperature difference $\Delta T$ decreases. This is due to the following reason.

In the battery pack 10 of the first embodiment, when the battery cell 100 is disposed further inside the battery pack 10, Joule heat generated by electrification is not likely to escape outside the battery pack 10. That is, when the battery cell 100 is disposed further inside the battery pack 10, the battery cell has a tendency to serve as a highest temperature cell. When the battery cell 100 is disposed further outside the battery pack 10, the battery cell has a tendency to serve as a lowest temperature cell.

On the other hand, the Joule heat generated by electrification increases as the internal resistance of the lowest temperature cell becomes larger. Therefore, the temperature difference between the battery cell 100 disposed inside the battery pack 10 and the battery cell 100 disposed outside the battery pack becomes larger temporarily in the beginning of constant current charge, and equilibrates with elapse of the charge. That is, the temperature difference $\Delta T$ between the highest temperature cell and the lowest temperature cell also becomes larger temporarily, and decreases after the maximum value $T_M$ (after time $t_2$).

Meanwhile, when charge at a constant current is performed, the voltage difference $\Delta V$ between the voltage $V_a$ of the maximum voltage cell and the voltage $V_n$ of the minimum voltage cell also changes mainly depending on the internal resistance differences of the battery cells 100, and thus increases in association with a change in temperature difference $\Delta T$.

Further, in FIG. 5(a), at time $t_2$ to time $t_3$, the temperature difference $\Delta T$ decreases. Accordingly, as shown in FIG. 5(b), the voltage difference $\Delta V$ between the voltage $V_a$ of the maximum voltage cell and the voltage $V_b$ of the minimum voltage cell is also reduced. In the meantime, the temperature difference $\Delta T$ is equal to or greater than the reference value $T_1$ and satisfies the first temperature condition (S130; Yes). For this reason, the charge continues as it is. On the other hand, when the temperature difference $\Delta T$ does not satisfy the first temperature condition (S130; No), S142 may be determined on the basis of the voltages measured by the voltage and current measurement unit 340. When the voltage difference $\Delta V$ between the voltage $V_a$ of the maximum voltage cell and the voltage $V_b$ of the minimum voltage cell is equal to or greater than the first reference voltage value $V_1$, the above-mentioned balance control is performed (S150).

In FIG. 5(b), at time $t_3$, it is assumed that the total voltage of the battery pack 10 reaches $NV_c$. In this case, the charge method switches from constant current charge to constant voltage charge. After time $t_3$, the voltage $V_b$ of the minimum voltage cell converges on a constant voltage $V_c$. In addition, the voltage $V_a$ of the battery cell 100 (lowest temperature cell) having the highest voltage is set to the maximum value $V_M$ at time $t_3$, and thus converges on the constant voltage $V_c$ after time $t_3$. Meanwhile, it is assumed that the maximum value $V_M$ is less than the over-charge detection voltage value.

In FIG. 5(c), after time $t_3$, the charge method switches from the constant current charge to the constant voltage charge, and the current is gradually reduced from $I_{C1}$. At time $t_f$, the current becomes a predetermined charge termination current value $I_0$.

In FIG. 5(c), until time $t_f$, the residual capacities of all the battery cells 100 increase equally. At time $t_f$, simultaneously, the residual capacities of all the battery cells 100 are set to a full charge capacity $C_R$.

In this case, the battery cell 100 is fully-charged, and thus the battery control unit 400 terminates the charge (S170). Specifically, the battery control unit 400 transmits a signal for stopping the charge to the switch 500 through the voltage and current measurement unit 340.

In this manner, when the temperature difference ΔT is equal to or greater than the reference value $T_1$, the charge is performed until full charge without performing the balance control.

As described above, the battery pack 10 according to the first embodiment is controlled.

(Effect)

Next, an effect of the first embodiment will be described using FIG. 7 as a comparative example. FIG. 7 is a diagram illustrating a comparative example for describing the effect of the first embodiment.

Unlike the first embodiment, FIG. 7 shows a comparative example in which the battery control unit 400 does not perform control on the basis of the temperature of the battery cells 100. The flow diagram of the comparative example may not have the steps of S120 to S130 in FIG. 3. That is, in the comparative example, the battery control unit 400 performs only control based on voltage. Meanwhile, in the comparative example, the state of the charge start is also the same as that in the first embodiment.

FIG. 7(*a*) shows a relationship between the time from the charge start time, and the temperature difference ΔT between the highest temperature cell and the lowest temperature cell in the comparative example. FIG. 7(*b*) shows a relationship between the time from the charge start time, and the voltage $V_a$ of the battery cell 100 having the highest voltage and the average voltage $V_b$ among the battery cells 100, in the comparative example. In addition, the drawing shows a relationship between the time from the charge start time, and the voltage difference ΔV between the voltage $V_a$ of the maximum voltage cell and the voltage $V_b$ of the minimum voltage cell, in the comparative example. In addition, FIG. 7(*c*) shows a relationship between the time from the charge start time, and a residual capacity $C_a$ of the battery cell 100 having a maximum voltage and a residual capacity $C_b$ of the minimum voltage cell, in the comparative example. Further, FIG. 7(*c*) shows a relationship between the time from the charge start time and the current of the battery cell 100 in the first embodiment. Meanwhile, the interval of the horizontal axis in FIG. 7 is assumed to be the same as the interval of the horizontal axis in FIG. 5.

As shown in FIG. 7(*c*), charge until time $t_1$ is constant current charge. The current of all the battery cells 100 is kept constant at the constant current value $I_{C1}$.

As shown in FIG. 7(*a*), in the comparative example, the temperature difference ΔT between the highest temperature cell and the lowest temperature cell increases monotonically in the initial step of the charge at earlier than time $t_1$. At time $t_1$, the temperature difference ΔT between the highest temperature cell and the lowest temperature cell becomes the reference value $T_1$. Here, as is the case with the first embodiment, it is assumed that the main cause for the occurrence of a difference in the internal resistances of the battery cells 100 is a temperature difference. In this case, the maximum voltage cell is a lowest temperature cell, whereas the minimum voltage cell is a highest temperature cell.

As shown in FIG. 7(*b*), while the above-mentioned temperature difference ΔT increases from the charge start, the voltage difference ΔV between the voltage $V_a$ of the maximum voltage cell and the voltage $V_b$ of the minimum voltage cell increases due to a change in internal resistance over time. At time $t_1$, the voltage difference ΔV between the maximum voltage cell and the minimum voltage cell becomes the first reference voltage value $V_1$.

Here, in the comparative example, for example, the battery control unit 400 performs the balance control as follows in order to reduce the voltage difference ΔV between the maximum voltage cell and the minimum voltage cell.

First, the battery control unit 400 turns on the first cell switch 204 which is disposed in parallel with the maximum voltage cell. Thereby, the charge current is shunted to the internal resistor 202 which is disposed in parallel with the maximum voltage cell. That is, the battery control unit 400 suppresses an increase in the voltage $V_a$ of the maximum voltage cell. On the other hand, the battery control unit 400 opens the first cell switches 204 which are disposed in parallel with other battery cells 100. For this reason, the voltages of other battery cells 100 continue to increase monotonically.

In FIG. 7(*b*), after time $t_1$, an increase in the voltage $V_a$ of the maximum voltage cell is suppressed. On the other hand, the voltage $V_b$ of the minimum voltage cell continues to increase monotonically.

In FIG. 7(*c*), after time $t_1$, the charge current is shunted to the internal resistor 202 which is disposed in parallel with the maximum voltage cell. For this reason, an increase in the residual capacity $C_a$ of the battery cell 100 having the highest voltage is suppressed. On the other hand, the residual capacity $C_b$ of the minimum voltage cell continues to increase monotonically.

At time $t_4$ after elapse of a predetermined period, the battery control unit 400 stops the balance control.

In FIG. 7(*b*), at time $t_4$, the voltage $V_a$ of the maximum voltage cell comes close to the voltage $V_b$ of the minimum voltage cell. After time $t_4$, the voltage rises simultaneously with the stop of the balance control.

In FIG. 7(*c*), an increment in the residual capacity $C_a$ of the maximum voltage cell from time $t_1$ to time $t_4$ is smaller than an increment in the residual capacity $C_b$ of the minimum voltage cell. Until time $t_1$, the residual capacities of all the battery cells 100 are equal to each other, but the residual capacity of the battery cell 100 targeted for control is shifted by the balance control, as compared with the residual capacities of other battery cells 100.

Meanwhile, the generation of heat in the maximum voltage cell is reduced in association with a reduction in charge current flowing into the maximum voltage cell by the balance control after time $t_1$. For this reason, as shown in FIG. 7(*a*), an increase in temperature difference ΔT decreases temporarily during time $t_1$ to time $t_4$. After time $t_4$, the temperature difference ΔT increases gently again in association with the stop of the balance control, and then becomes a maximum value $T_{M2}$ at time $t_5$. Next, after time $t_5$, the temperature difference ΔT decreases.

The battery control unit 400 continues the charge further. At time $t_6$, the total voltage of the battery pack 10 is assumed to reach $NV_C$. In this case, the charge switches from the constant current charge to the constant voltage charge.

In FIG. 7(*b*), after time $t_6$, the voltage $V_a$ of the battery cell 100 having the highest voltage gradually comes close to $V_C$. In addition, in FIG. 7(*c*), after time $t_6$, the current is gradually reduced from $I_{C1}$.

Here, at time $t_f$, in the first embodiment, all the battery cells 100 are fully-charged. On the other hand, in the comparative example, all the battery cells 100 are not fully-charged yet. In the comparative example, it requires more time to fully-charge all the battery cells 100.

In this manner, in the comparative example, even when the residual capacities of the respective battery cells 100 are equal to each other, the balance control is performed. The residual capacity of the maximum voltage cell targeted for the balance control has a larger shift than the capacities of other battery cells 100. That is, there is the possibility of the residual capacities of the battery cells 100 varying.

In addition, in the comparative example, in order to fully-charge at least the battery cell 100 targeted for the control, there is the possibility that it may require more time than in a case where the balance control is not performed.

As described above, in the comparative example, even when the balance control is unnecessary, there is the possibility of the battery control unit 400 performing the balance control. Particularly, when the battery pack 10 is under a low-temperature environment, a large difference in internal resistance occurs due to a small temperature difference. In such a case, there is a high possibility of the battery control unit 400 performing unnecessary balance control.

On the other hand, according to the first embodiment, when the first temperature condition in which the temperature difference ΔT between the highest temperature cell and the lowest temperature cell is equal to or greater than the reference value $T_1$ is not satisfied, the battery control unit 400 performs the balance control for equalizing the voltages of the all the battery cells 100 on the basis of the voltages measured by the voltage and current measurement unit 340. On the other hand, when the temperature difference ΔT satisfies the first temperature condition, the battery control unit 400 does not perform the balance control.

Thereby, when the cause for the occurrence of the voltage difference between each of the battery cells 100 is a temperature difference between each of the battery cells 100, it is possible for the balance control not to be performed. That is, when the residual capacities of the respective battery cells 100 are equal to each other, unnecessary balance control is not performed.

Therefore, according to the first embodiment, it is possible to stably charge the battery pack 10 while appropriately determining the cause for the occurrence of the voltage difference between each of the battery cells 100.

In addition, as described above, particularly when the battery pack 10 is under a low-temperature environment, the voltage difference has a tendency to occur due to a difference in internal resistance. The first embodiment is particularly effective in such a case.

Modified Example

The first embodiment can be modified as follows. In the following modified example, the same effects as that in the first embodiment are also obtained.

In the first embodiment, a case where the battery cell 100 having a maximum voltage is a lowest temperature cell has been described. However, the battery cell 100 having a maximum voltage may not be a lowest temperature cell. In this case, it is also possible to obtain the same effect as that in the first embodiment. Meanwhile, in this case, the battery cell 100 of which the voltage becomes maximum is targeted for determination in S142.

In addition, in the first embodiment, a case has been described in which it is determined in S142 whether the voltage difference is equal to or greater than the first reference voltage value. However, as shown in FIG. 4, instead of S142, the battery control unit 400 may determine whether there is a battery cell 100 in which a difference between the voltage thereof and an average voltage of the battery cells 100 is equal to or greater than a second reference voltage value in the "balance control", on the basis of the voltages measured by the voltage and current measurement unit 340 (S144). When there is a battery cell 100 in which the difference between the voltage thereof and the average voltage of the battery cells 100 is equal to or greater than the second reference voltage value (S144; Yes), the battery control unit 400 may control the corresponding battery cell 100 so that the voltage difference (difference from the average voltage) decreases (S150).

That is, in FIG. 4, when the temperature difference between the highest temperature cell and the lowest temperature cell is less than the reference value (the first temperature condition is not satisfied), and the voltage difference is equal to or greater than the second reference value, the determination condition of the balance control can be changed by performing the above-mentioned balance control. Thereby, as is the case with the first embodiment, the voltage difference of the battery cell 100 is caused by the temperature difference, and thus it is possible to equalize the voltages of all the battery cells 100. Meanwhile, the "difference from the average voltage is equal to or greater than the second reference voltage value" as used herein includes a case where the voltage of a specific battery cell 100 is equal to or greater than the second reference voltage value higher than the average voltage, and a case where the voltage is equal to or greater than the second reference voltage value lower than the average voltage.

In addition, in the battery pack 10 according to the first embodiment, as described in S130 and S142 of FIG. 3, the condition for equalizing the voltages in the balance control is set to "(the temperature difference between the highest temperature cell and the lowest temperature cell is less than the reference value, and the voltage difference between the maximum voltage cell and the minimum voltage cell is equal to or greater than the first reference voltage value)". This condition may be modified to "(the temperature difference between the highest temperature cell and the lowest temperature cell is less than the reference value, and a voltage difference $ΔV_1$ between the maximum voltage cell and the minimum voltage cell is equal to or greater than the first reference voltage value), or (the temperature difference between the highest temperature cell and the lowest temperature cell is equal to or greater than the reference value, and a voltage difference $ΔV_2$ between the highest temperature cell and the lowest temperature cell is equal to or greater than a third reference voltage value)". Meanwhile, the "voltage difference $ΔV_2$" refers to a value obtained by subtracting the voltage of the lowest temperature cell from the voltage of the highest temperature cell.

That is, when the voltage of the highest temperature cell having a smaller internal resistance is higher (when the "voltage difference $ΔV_2$" is positive), there is a high possibility of the voltage difference not being caused by the temperature difference of the battery cell 100, and thus it is possible to equalize the voltage difference, and to equalize the capacity difference.

In this case, further, the battery control unit 400 can store information for specifying which battery cell 100 is the battery cell 100 provided with the temperature sensor, compare the voltages of the battery cells 100 on the basis of the information, and determine the above-mentioned condition. Therefore, even when the condition for equalizing the voltages in the balance control is modified as described above, the voltage difference of the battery cell 100 is not caused by the temperature difference, and thus it is possible to equalize the voltages of all the battery cells 100.

In addition, in the battery pack 10 according to the above-mentioned first embodiment, the voltage and current measurement unit 340 has detected the electrification of the battery cell 100 on the basis of the voltage value applied to the resistor 360. However, a detection method of electrification is not limited thereto. For example, the battery control unit 400 may detect electrification using a signal for stopping the charge or discharge which is transmitted to the switch 500 through the voltage and current measurement unit 340. In this case, the battery control unit 400 serves as an electrification detection unit, and the battery control unit 400 can determine a case where a signal for turning on a MOSFET for charge or discharge is transmitted to be a case where electrification is performed.

In addition, when the battery control unit 400 serves as the electrification detection unit, the battery control unit 400 may also use a signal which is received from the charger 90 through the communication terminal 730. In this case, the battery control unit 400 can determine that electrification is performed, in "a case where a state signal indicating a charge operation is received from the charger 90 through the communication terminal 730", and "a case where the battery control unit 400 transmits a signal for turning on a MOSFET for charge or discharge".

Second Embodiment

Figure 8:
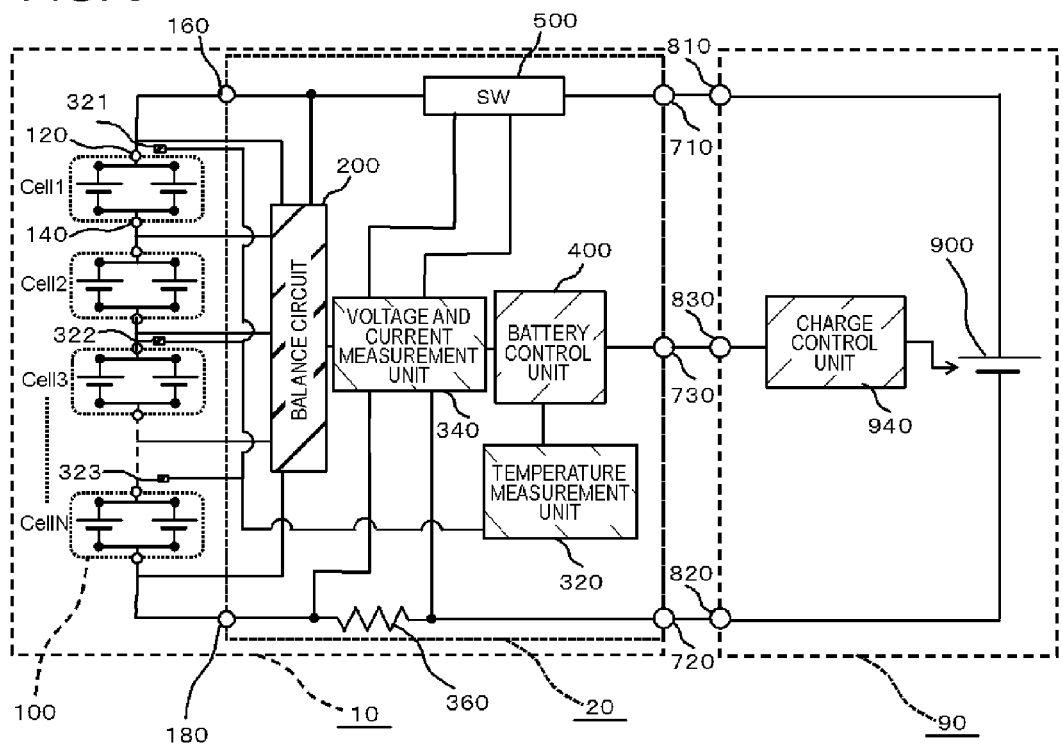
FIG. 8 is a circuit diagram illustrating a configuration of a battery pack according to a second embodiment.
Figure 9:
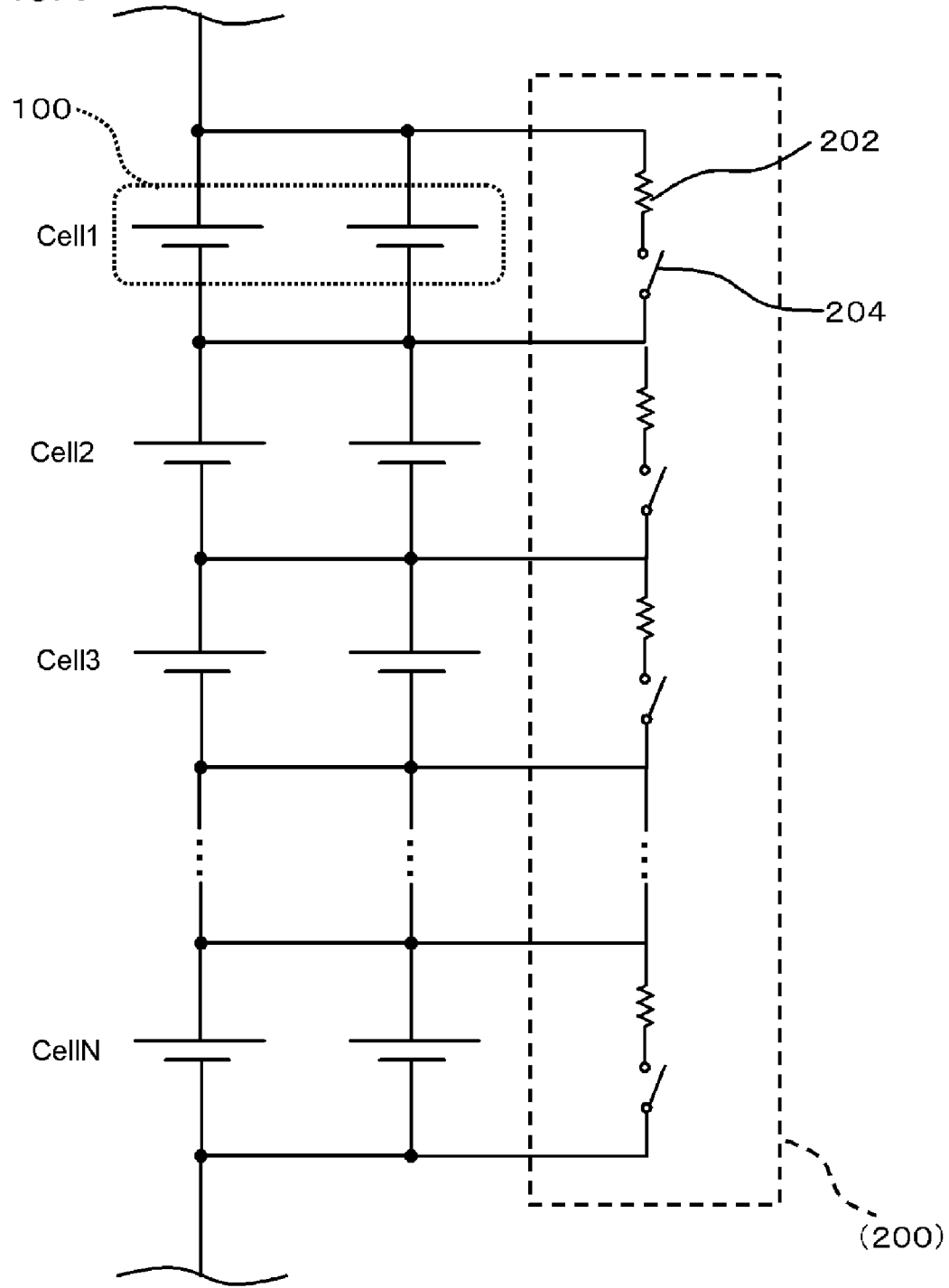
FIG. 9 is an equivalent circuit diagram in the vicinity of battery cells of the battery pack according to the second embodiment.

A second embodiment will be described with reference to FIGS. 8 and 9. FIG. 8 is a circuit diagram illustrating a configuration of a battery pack 10 according to the second embodiment. FIG. 9 is an equivalent circuit diagram in the vicinity of the battery cells 100 of the battery pack 10 according to the second embodiment. The second embodiment is the same as the first embodiment, except for the following points. The battery pack 10 of the second embodiment further includes a balance circuit 200 that adjusts the voltages of the battery cells 100. In addition, the battery control unit 400 performs balance control by controlling the balance circuit 200. Hereinafter, a detailed description will be given.

In the second embodiment, the balance circuit 200 which is a unit that adjusts the voltage of each of the battery cells 100 in the battery control unit 400 according to the first embodiment is provided independently.

As shown in FIG. 8, the balance circuit 200 is connected between each of the battery cells 100 through an interconnect (no sign shown). Thereby, the balance circuit 200 can adjust the voltages of the battery cells 100.

In addition, the voltage and current measurement unit 340 is connected to the balance circuit 200. The voltage and current measurement unit 340 measures the voltage of each of the battery cells 100 through the balance circuit 200.

The battery control unit 400 is connected to the balance circuit 200 through the voltage and current measurement unit 340. The battery control unit 400 controls the balance circuit 200 through the voltage and current measurement unit 340.

As is the case with the first embodiment, the battery control unit 400 connected to the voltage and current measurement unit 340 and the temperature measurement unit 320. The battery control unit 400 controls a balance circuit on the basis of the voltages and currents measured by the voltage and current measurement unit 340, and the temperatures measured by the temperature measurement unit 320.

Here, the equivalent circuit in the vicinity of the battery cells 100 according to the second embodiment will be described with reference to FIG. 9. FIG. 9 shows an equivalent circuit of the balance circuit 200. A dotted line in the drawing shows the inside of the balance circuit 200.

As shown in FIG. 9, the balance circuit 200 is connected to each of the battery cells 100 through an interconnect (no sign shown). In the balance circuit 200, the internal resistor 202 and the first cell switch 204 are disposed in parallel with each of the battery cells 100.

The battery control unit 400 performs the balance control by bringing the balance circuit 200 into operation when a voltage difference occurs between each of the battery cells 100, on the basis of the voltages measured by the voltage and current measurement unit 340. Specific operation of the balance control performed by the balance circuit 200 are the same as the operations of the battery control unit 400 in the first embodiment.

A control method according to the second embodiment is the same as that in the first embodiment, except that the balance control performed by the battery control unit 400 is performed by the battery control unit 400 controlling the balance circuit 200.

According to the second embodiment, the balance circuit 200 is included as a separate system from the battery control unit 400. In such a configuration, it is also possible to obtain the same effect as that in the first embodiment.

Third Embodiment

Figure 10:
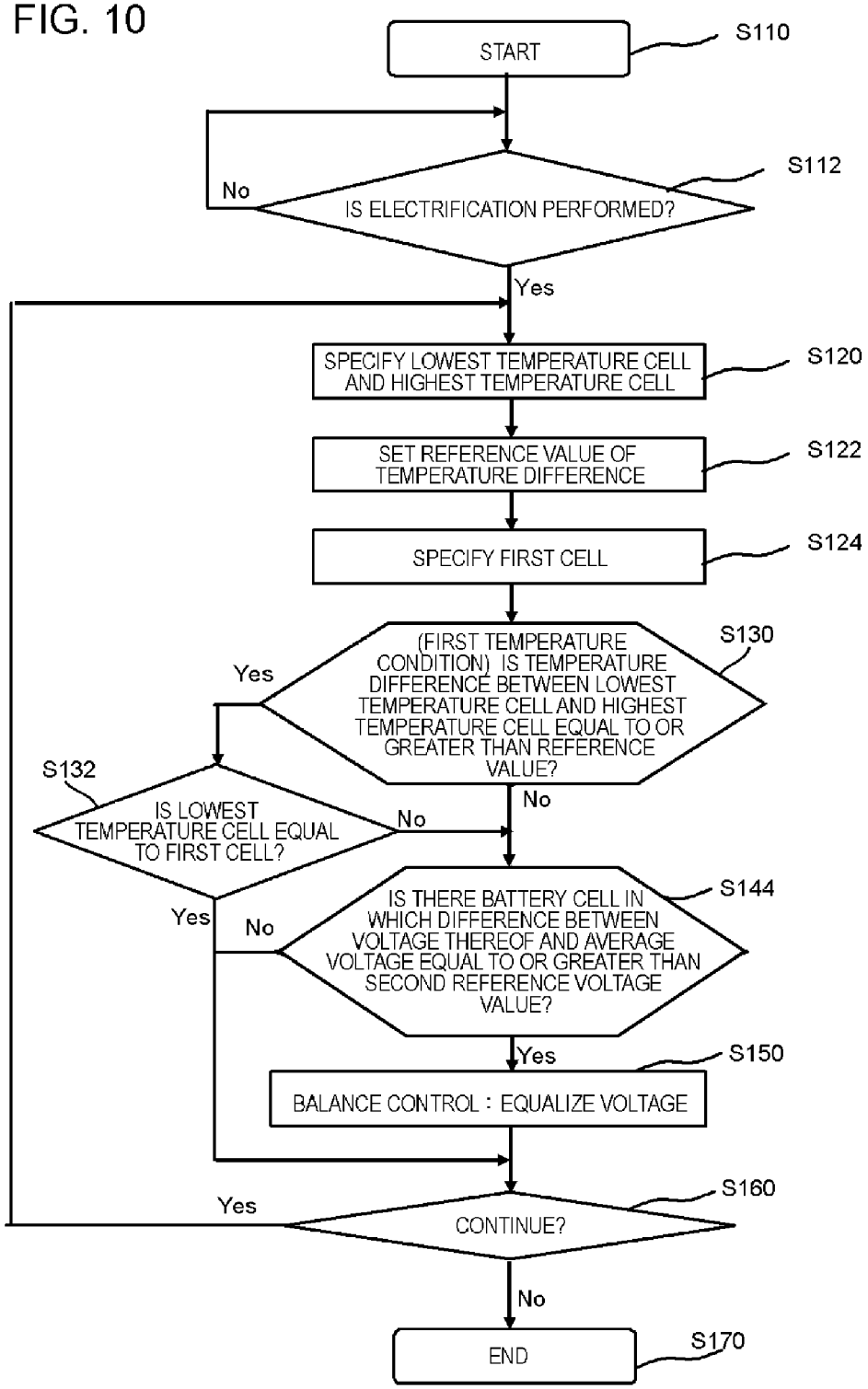
FIG. 10 is a flow diagram illustrating a control method according to a third embodiment.

FIG. 10 is a flow diagram illustrating a control method according to a third embodiment. The third embodiment is the same as the first embodiment, except for the following points. The battery control unit 400 further specifies a first cell having the highest voltage when the battery cell 100 is charged, on the basis of the voltages measured by the voltage and current measurement unit 340. In addition, the battery control unit 400 does not perform the balance control when the temperature difference $\Delta T$ satisfies the first temperature condition, and the lowest temperature cell is the same as the first cell. On the other hand, when the temperature difference $\Delta T$ satisfies the first temperature condition, and the lowest temperature cell is different from the first cell, the balance control is performed. Hereinafter, a detailed description will be given. Meanwhile, in the "first cell", the "battery cell" can be replaced by the "battery unit", and also be replaced by the "first unit".

The third embodiment can have the same configuration as that of the battery pack 10 of the first embodiment. In the following, a first case is a case where the battery pack 10 in which the full charge capacities of all the battery cells 100 are equal to each other. On the other hand, a second case is a case where the battery pack 10 in which the battery cells 100 having different full charge capacities are combined. In such two cases, the control method according to the second embodiment will be described.

As is the case with the first embodiment, charge is started by a constant-current and constant-voltage charging method (S110). Next, the battery control unit 400 determines whether the current is greater than 0 on the basis of the current measured by the voltage and current measurement unit 340 (S112). As described above, "when current is greater than 0", as used herein, the current being measured by the voltage and current measurement unit 340, refers to a case when the battery pack 10 is electrified. Here, since the charge of the battery pack 10 is performed, the current is greater than 0 (S112; Yes).

Next, the battery control unit 400 specifies the lowest temperature cell and the highest temperature cell (S120). Next, the battery control unit 400 sets, for example, the reference value $T_1$ of the temperature difference $\Delta T$ on the basis of the temperature of the lowest temperature cell (S122).

Next, when the charge of the battery cell 100 is performed, the battery control unit 400 specifies the "first cell" which is the battery cell 100 having the highest voltage (S124).

Here, in the first case, as described using FIG. 6, a difference in internal resistance occurs due to a temperature difference between each of the battery cells 100. For this reason, the internal resistance of the lowest temperature cell becomes maximum. Therefore, there is the possibility of the lowest temperature cell becoming the battery cell 100 having the highest voltage. Thus, in the first case, the lowest temperature cell is assumed to be the "first cell".

On the other hand, in the second case, the battery cells 100 having different full charge capacities are combined, and thus the first cell in this step is not necessarily a lowest temperature cell. In this case, regardless of temperature, there is the possibility of the battery cell 100 having a smallest full charge capacity becoming the battery cell 100 having the highest voltage. Thus, in the second case, the battery cell 100 having a smallest full charge capacity is assumed to be the "first cell".

Next, the first temperature condition in which the temperature difference $\Delta T$ between the highest temperature cell and the lowest temperature cell is equal to or greater than the reference value $T_1$ is determined (S130).

Here, the temperature difference $\Delta T$ between the highest temperature cell and the lowest temperature cell is assumed to be equal to or greater than the reference value $T_1$. That is, the temperature difference $\Delta T$ satisfies the first temperature condition.

In this manner, when the temperature difference $\Delta T$ satisfies the first temperature condition (S130; Yes), it is determined whether the lowest temperature cell is equal to the first cell (S132).

Here, in the first case, as described above, since the lowest temperature cell is the first cell (S132; Yes), the battery control unit 400 does not perform the balance control, and continues the charge 160; as it is (160; Yes). In this manner, in the first case, even when a voltage difference occurs between each of the battery cells 100, the cause is determined to be a temperature difference between each of the battery cells 100, and thus it is possible for the balance control not to be performed.

On the other hand, in the second case, as described above, the battery cell 100 having a smallest full charge capacity is the first cell, and thus the lowest temperature cell is different from the first cell (S132; No). Therefore, the battery control unit 400 determines whether there is a battery cell 100 in which a difference between the voltage thereof and the average voltage of the battery cells 100 is equal to or greater than the second reference voltage value, on the basis of the voltages measured by the voltage and current measurement unit 340 (S144).

In this case, when a difference between the voltage of the battery cell 100 having a smallest full charge capacity and the average voltage is equal to or greater than the second reference voltage value (S144; Yes), the battery control unit 400 performs the balance control (S150). In this manner, in the second case, it can be determined that the cause for the occurrence of the voltage difference between each of the battery cells 100 is not a temperature difference. In this case, the battery cell 100 having a smallest full charge capacity is targeted for control, and the balance control can be performed.

Hereinafter, S120 to S160 are repeated, and the charge is performed.

According to the third embodiment, the battery control unit 400 does not perform the balance control when the temperature difference $\Delta T$ satisfies the first temperature condition, and the lowest temperature cell is the same as the first cell having the highest voltage. On the other hand, when the temperature difference $\Delta T$ satisfies the first temperature condition, and the lowest temperature cell is different from the first cell, the balance control is performed. In this manner, whether the balance control is applied can be selected depending on whether the cause for the occurrence of the voltage difference between each of the battery cells 100 is a temperature difference.

Fourth Embodiment

A fourth embodiment will be described with reference to FIGS. 11 to 14. The fourth embodiment is the same as the first embodiment, except for the following points. In the fourth embodiment, the first embodiment is applied to the discharge. In addition, the battery control unit 400 includes a circuit that bypasses the battery cell 100 targeted for the balance control. Hereinafter, a detailed description will be given.

Figure 11:
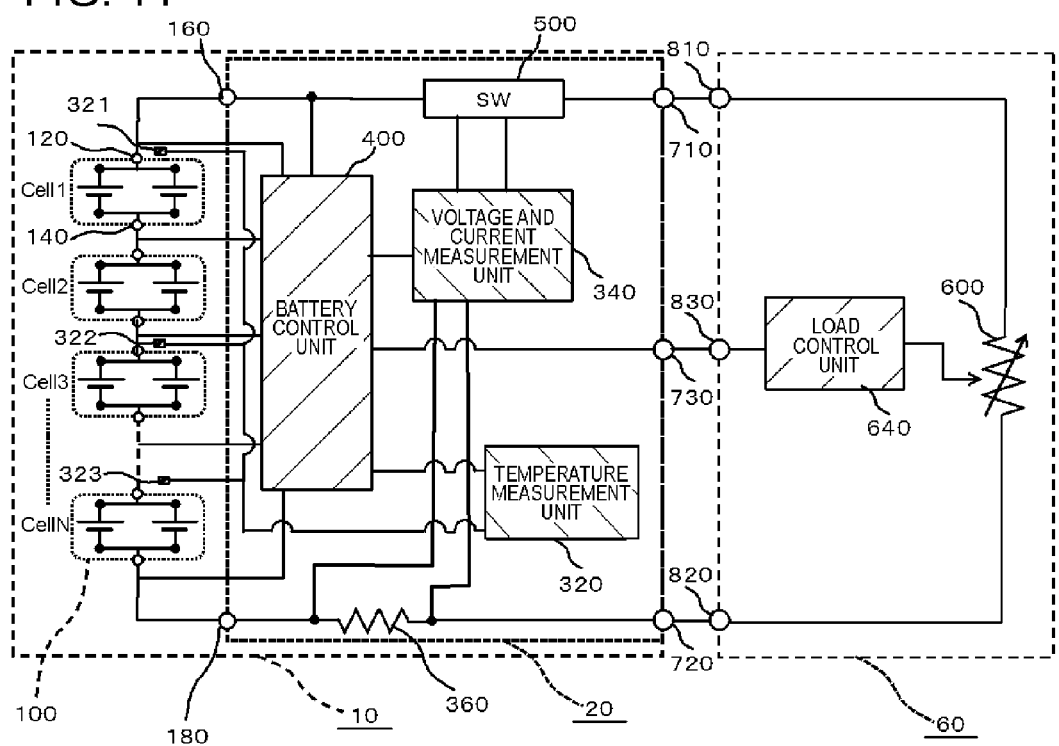
FIG. 11 is a circuit diagram illustrating a configuration of a battery pack according to a fourth embodiment.

In the fourth embodiment, a case where the discharge of the battery pack 10 is performed will be described. FIG. 11 is a circuit diagram illustrating a configuration of a battery pack 10 according to the fourth embodiment. As shown in FIG. 11, the battery pack 10 is connected to, for example, the electronic device 60. In the drawing, the electronic device 60 is shown schematically. The load 600, provided therein, consumes power due to the discharge from the battery pack 10 by controlling the load control unit 640. The load 600 is connected to a positive electrode terminal 810 and a negative electrode terminal 820 through an interconnect (not shown). The positive electrode terminal 810 and the negative electrode terminal 820 of the electronic device 60 are connected to the external positive electrode terminal 710 and the external negative electrode terminal 720 of the battery pack 10 through, for example, an interconnect (no sign shown). Thereby, the electronic device 60 can receive power due to the discharge of the battery pack 10.

Figure 12:
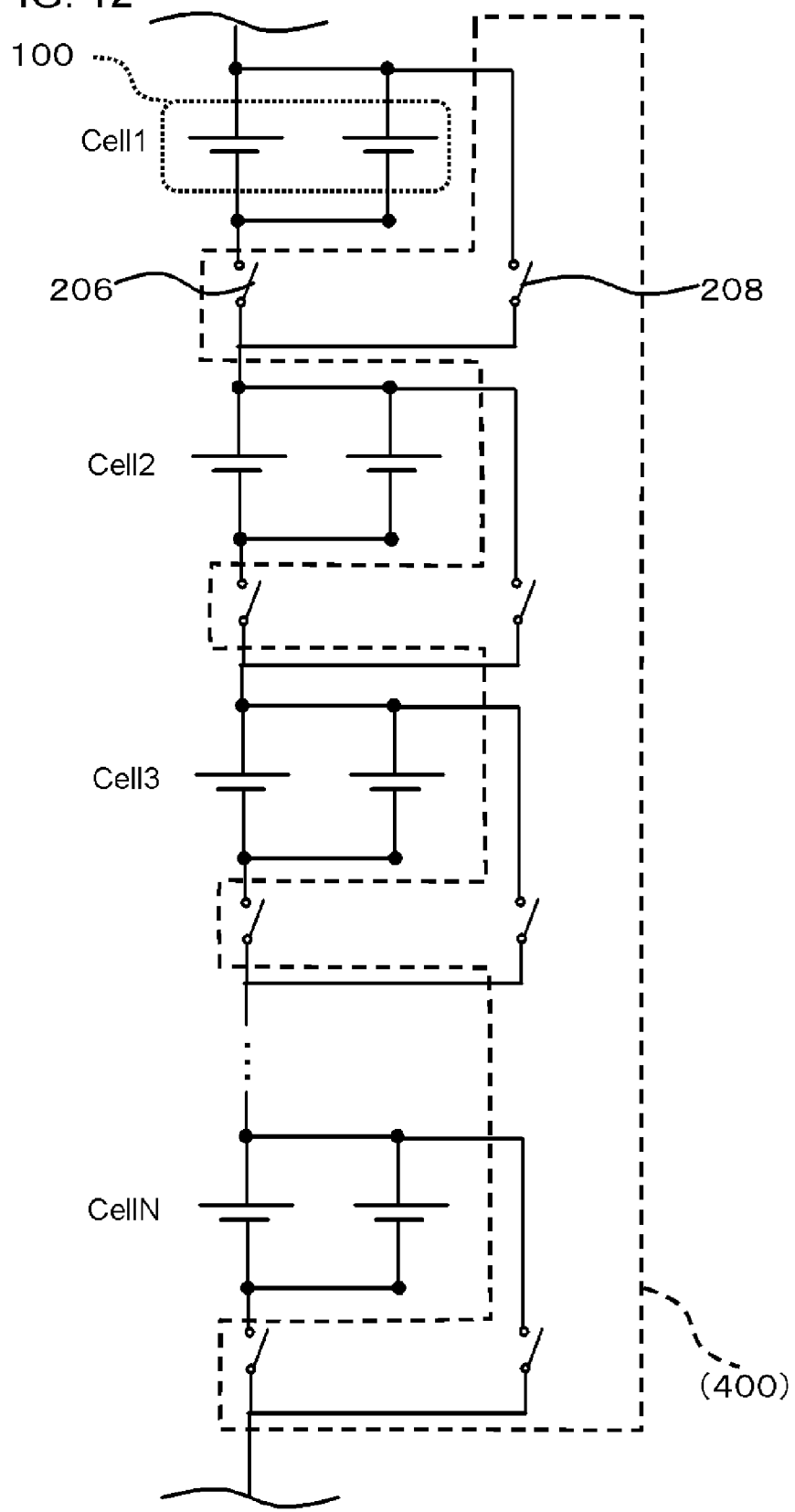
FIG. 12 is an equivalent circuit diagram in the vicinity of battery cells of the battery pack according to the fourth embodiment.

Next, a battery control unit 400 according to the fourth embodiment will be described with reference to FIG. 12. FIG. 12 is an equivalent circuit diagram in the vicinity of the battery cell 100 of the battery pack 10 according to the fourth embodiment. As shown in FIG. 12, in the fourth embodiment, the battery control unit 400 includes, for example, the following configuration.

As shown in FIG. 12, in the fourth embodiment, the "balance control" is, for example, a "bypass type". The battery control unit 400 is connected to each of the battery cells 100 through an interconnect (no sign shown). The respective battery cells 100 are connected to each other through a second cell switch 206. In the battery control unit 400, a third cell switch 208 is disposed in parallel with each of the battery cells 100 and the second cell switch 206. The second cell switch 206 and the third cell switch 208 may be turned on individually, but are controlled so as not to be turned on simultaneously. Thereby, the battery control unit 400 prevents the battery cells 100 from being short-circuited between positive and negative electrodes.

In addition, when a normal battery pack 10 is discharged, or the like, the battery control unit 400 turns on the second cell switch 206, and turns off the third cell switch 208.

On the other hand, the battery control unit 400 performs the balance control by bypassing a target battery cell 100. In this balance control, when the battery cell 100 is bypassed, the second cell switch 206 connected to the battery cell 100 is turned off, and the third cell switch 208 which is disposed in parallel with the battery cell 100 is turned on. Thereby, it is possible to bypass the battery cell 100 targeted for control. Meanwhile, the "second cell switch 206 connected to the battery cell 100" as used herein refers to the second cell switch 206 connected to the negative electrode side of the battery cell 100.

For example, when the voltage difference ΔV between the maximum voltage cell and the minimum voltage cell is equal to or greater than the first reference voltage value $V_1$, the battery control unit 400 performs control so that the voltage difference decreases in the balance control, on the basis of the voltages measured by the voltage and current measurement unit 340. Here, the battery control unit 400 bypasses, for example, the minimum voltage cell. Thereby, it is possible to equalize the voltages of the battery cells 100.

Next, a method of controlling the battery pack 10 according to the fourth embodiment will be described with reference to FIGS. 3 and 13.

Figure 13:
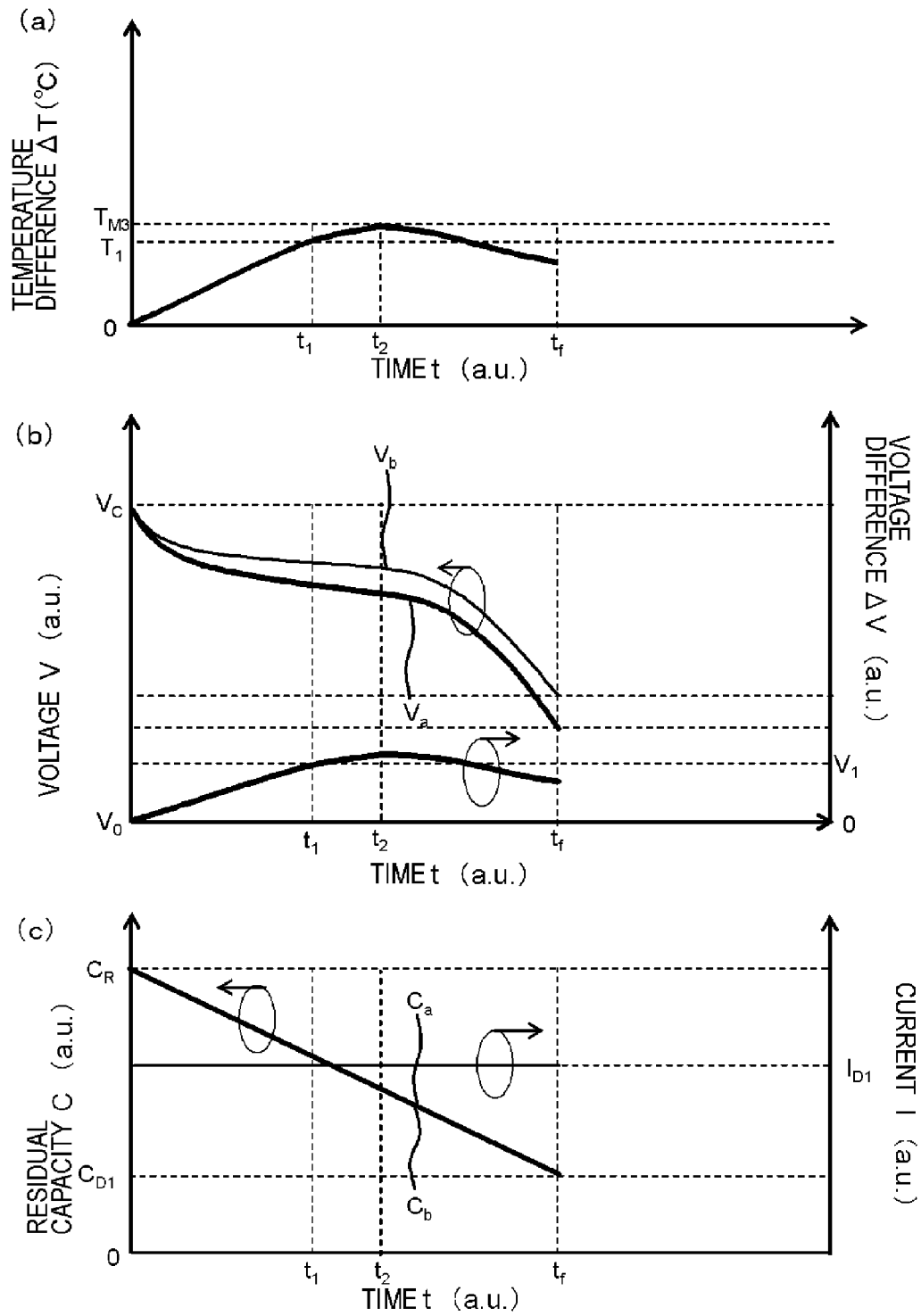
FIG. 13 is a diagram illustrating a control method according to the fourth embodiment.

FIG. 13 is a diagram illustrating a control method according to the fourth embodiment. FIG. 13(a) shows a relationship between the time from the discharge start time, and the temperature difference ΔT between the highest temperature cell and the lowest temperature cell in the fourth embodiment. FIG. 13(b) shows a relationship between the time from the discharge start time, and the voltage $V_a$ of the battery cell 100 having the lowest voltage and the voltage $V_b$ of the battery cell 100 having the highest voltage among the battery cells 100, in the fourth embodiment. In addition, the drawing shows a relationship between the time from the charge start time, and the voltage difference ΔV (absolute value) between the maximum voltage cell and the lowest temperature cell, in the fourth embodiment. As compared with the first embodiment, attention is paid to a point that portions assigned signs of a and b are different from each other. In addition, FIG. 13(c) shows a relationship between the time from the discharge start time, and the residual capacity $C_a$ of the battery cell 100 having the lowest voltage and the residual capacity $C_b$ of the battery cell 100 having the highest voltage among the battery cells 100, in the fourth embodiment. Further, FIG. 13(c) shows a relationship between the time from the charge start time and the current of the battery cell 100 in the fourth embodiment.

Here, the full charge capacities of the respective battery cells 100 are assumed to be equal to each other at $C_R$. In addition, each of the battery cells 100 is assumed to be charged up to the full charge capacity. In addition, the voltage in the discharge of each of the battery cells 100 in the initial step is, for example, $V_c$.

As shown in FIG. 3, first, the discharge is started. Specifically, the positive electrode terminal 810 and the negative electrode terminal 820 of the electronic device 60 are respectively connected to the external positive electrode terminal 710 and the external negative electrode terminal 720 of the battery pack 10. Thereby, the discharge from the battery pack 10 is started. At the same time, the temperature measurement unit 320 starts to measure the temperature of the battery cell 100 provided with the temperature sensor. In addition, the voltage and current measurement unit 340 starts to measure the voltages of a plurality of battery cells 100 which are connected in series to each other (S110). Thereby, power due to the discharge of the battery pack 10 is consumed by the load 600 of the electronic device 60.

Next, the battery control unit 400 determines whether the current is greater than 0 on the basis of the current measured by the voltage and current measurement unit 340 S112). As described above, "when current is greater than 0", as used herein, the current being measured by the voltage and current measurement unit 340, refers to a case when the battery pack 10 is electrified. Here, since the discharge of the battery pack 10 is performed, the current is greater than 0 (S112; Yes).

Next, the battery control unit 400 specifies the lowest temperature cell having the lowest temperature and the highest temperature cell having the highest temperature on the basis of the temperatures measured by the temperature measurement unit 320 (S120).

As shown in FIG. 13(a), the temperature difference ΔT between the highest temperature cell and the lowest temperature cell increases monotonically in the initial step of the discharge at earlier than time $t_1$. Meanwhile, in the initial step, when the temperature difference is small, and it is difficult to specify the highest temperature cell and the lowest temperature cell, the highest temperature cell and the lowest temperature cell may be updated at any time.

In FIG. 13(c), the battery pack 10 is discharged at a constant current by the electronic device. For this reason, discharge until time $t_1$ is constant current discharge. In addition, all the battery cells 100 are connected in series to each other. Therefore, the current of all the battery cells 100 is kept constant at a constant current value $I_D$. Meanwhile, here, in order to simplify the description, a constant current is just assumed to be used, and it is possible to obtain an effect of the fourth embodiment even when a current changes.

As shown in FIG. 13(b), from the charge start, a difference in voltage occurs due to a difference in internal resistance. Here, as described above, the characteristics such as the full charge capacity of all the battery cells 100 are equal to each other. For this reason, only the internal resistances of the respective battery cells 100 are different from each other. Therefore, the lowest temperature cell having a largest internal resistance becomes, for example, the battery cell 100 (minimum voltage cell) having the lowest voltage. On the other hand, the highest temperature cell becomes, for example, the battery cell 100 (maximum voltage cell) having the highest voltage.

Next, as is the case with the first embodiment, the battery control unit 400 sets the "reference value T1 of the temperature difference ΔT" (S122). Here, for example, the "reference value T1 of the temperature difference ΔT" is set on the basis of the temperature of the lowest temperature cell. Meanwhile, the "reference value $T_1$ of the temperature difference ΔT" may be set in advance. In that case, this step can be omitted.

Next, the battery control unit 400 determines the first temperature condition in which the temperature difference ΔT between the highest temperature cell and the lowest temperature cell is equal to or greater than the reference value $T_1$ (S130).

Next, when the first temperature condition in which the temperature difference ΔT between the highest temperature cell and the lowest temperature cell is equal to or greater than the reference value $T_1$ is not satisfied (S130; No), the battery control unit 400 determines whether the voltage difference ΔV between the maximum voltage cell having the highest voltage and the minimum voltage cell having the lowest voltage is equal to or greater than the first reference voltage value $V_1$, on the basis of the voltages measured by the voltage and current measurement unit 340 (S142).

When the temperature difference ΔT does not satisfy the first temperature condition, and the voltage difference ΔV between the maximum voltage cell and the minimum voltage cell is less than the first reference voltage value $V_1$ (S142; No), the battery control unit 400 determines whether the discharge is continued as it is (S160). In this manner, when the voltage difference is small, it is possible for the balance control not to be performed.

On the other hand, when the temperature difference $\Delta T$ does not satisfy the first temperature condition, and the voltage difference $\Delta V$ between the maximum voltage cell having the highest voltage and the minimum voltage cell having the lowest voltage is equal to or greater than the first reference voltage value $V_1$ (S142; Yes), the balance control for equalizing the voltages of all the battery cells 100 is performed on the basis of the voltages measured by the voltage and current measurement unit 340 (S150). Thereby, the voltage difference between the maximum voltage unit and the minimum voltage unit is not caused by the temperature difference, and thus it is possible to equalize the voltages of all the battery cells 100.

Here, in FIG. 13(a), at earlier than time $t_1$, the temperature difference $\Delta T$ does not satisfy the first temperature condition (S130; No). In addition, as shown in FIG. 13(b), a difference between the voltage $V_a$ of the minimum voltage cell and the voltage $V_b$ of the maximum voltage cell is small. That is, a difference between the voltage $V_b$ of the maximum voltage cell and the voltage $V_a$ of the minimum voltage cell is equal to or less than the first reference voltage value $V_1$ (S142; No). The battery control unit 400 continues the charge as it is (S160; Yes).

In this manner, the discharge is performed while repeating S120 to S160. As described above, when the lowest temperature cell and the highest temperature cell are changed to different battery cells 100, these temperature cells may be updated to new battery cells 100 at any time.

Next, in FIG. 13(a), at time $t_1$, the temperature difference $\Delta T$ between the highest temperature cell and the lowest temperature cell becomes the reference value $T_1$. Therefore, the temperature difference $\Delta T$ satisfies the first temperature condition (S130; Yes).

Next, at time $t_1$, the battery control unit 400 continues the discharge as it is (S160; Yes).

In this case, as shown in FIG. 13(b), at time $t_1$, a difference between the voltage $V_b$ of the maximum voltage cell and the voltage $V_a$ of the minimum voltage cell becomes the first reference voltage value $V_1$. However, assuming that the voltage difference is caused by the temperature difference $\Delta T$, the battery control unit 400 continues the discharge as it is.

When the charge is continued as it is, an increase in temperature difference $\Delta T$ becomes gentle after time $t_1$ as shown in FIG. 13(a). Next, the temperature difference $\Delta T$ becomes a maximum value $T_{M3}$, and then the temperature difference $\Delta T$ decreases. This is due to the following reason. The Joule heat of the lowest temperature cell is larger than the Joule heat of the highest temperature cell due to the arrangement of the battery cells 100. Similarly, in the fourth embodiment, for example, the highest temperature cell is the battery cell 100 which is disposed inside the battery pack 10, whereas the lowest temperature cell is the battery cell 100 which is disposed outside the battery pack 10. For this reason, when the battery pack 10 is electrified, the internal resistance of the lowest temperature cell is higher than the internal resistance of the highest temperature cell. That is, the amount of heat generation due to the internal resistance of the lowest temperature cell becomes larger than that of the highest temperature cell. Therefore, a temperature rise of the lowest temperature cell becomes faster than that of the highest temperature cell. In this manner, after time $t_1$, an increase in temperature difference $\Delta T$ becomes gentle, and next, the temperature difference $\Delta T$ decreases.

In addition, as shown in FIG. 13(b), for example, at time $t_1$, the voltage difference $\Delta V$ between the voltage $V_b$ of the maximum voltage cell and the voltage $V_a$ of the minimum voltage cell becomes the first reference voltage value $V_1$. Even after time $t_1$, the voltage difference $\Delta V$ between the voltage $V_b$ of the maximum voltage cell and the voltage $V_a$ of the minimum voltage cell increases during time $t_1$ to time $t_2$ due to the increase of a difference in internal resistance, and an increase in voltage difference $\Delta V$ decreases gently.

In this manner, even after time $t_1$, the discharge is performed while repeating S120 to S160. When the temperature difference $\Delta T$ is equal to or greater than the reference value $T_1$ and the first temperature condition is satisfied, the discharge is performed continuously without performing the balance control. On the other hand, when the temperature difference $\Delta T$ satisfies the first temperature condition (S130; No), S142 may be determined on the basis of the voltages measured by the voltage and current measurement unit 340. When the voltage difference $\Delta V$ between the voltage $V_b$ of the maximum voltage cell and the voltage $V_a$ of the minimum voltage cell is equal to or greater than the first reference voltage value $V_1$, the above-mentioned balance control is performed (S150).

In FIG. 13(c), until time $t_f$, the residual capacities of all the battery cells 100 are reduced equally. At time $t_f$, simultaneously, the residual capacities of all the battery cells 100 are set to $C_{D1}$. In this manner, in the fourth embodiment, power of the battery cells 100 can be consumed equally.

As described above, the battery pack 10 according to the fourth embodiment is controlled.

Figure 14:
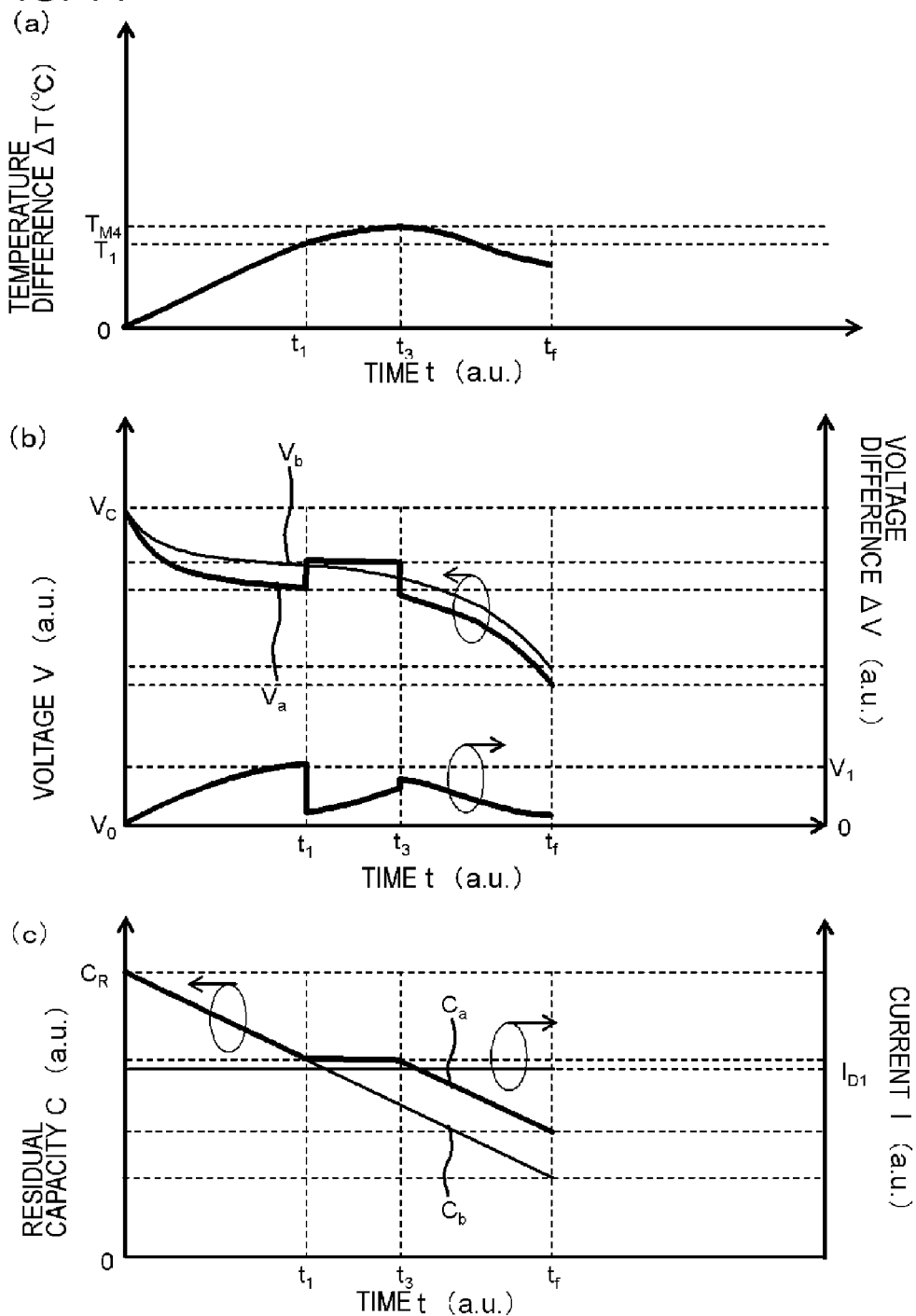
FIG. 14 is a diagram illustrating a comparative example for describing an effect of the fourth embodiment.

Next, an effect of the fourth embodiment will be described using FIG. 14 as a comparative example. FIG. 14 is a diagram illustrating a comparative example for describing the effect of the fourth embodiment.

Unlike the fourth embodiment, FIG. 14 shows a comparative example in which the battery control unit 400 does not perform control on the basis of the temperature of the battery cell 100. The flow diagram of the comparative example may not have the steps of S120 to S130 in FIG. 3. That is, in the comparative example, the battery control unit 400 performs only control based on a voltage. Meanwhile, in the comparative example, the state of the charge start is also the same as that in the fourth embodiment.

FIG. 14(a) shows a relationship between the time from the discharge start time, and the temperature difference $\Delta T$ between the highest temperature cell and the lowest temperature cell in the comparative example. FIG. 14(b) shows a relationship between the time from the discharge start time, and the voltage $V_a$ of the battery cell 100 having the lowest voltage and the voltage $V_b$ of the battery cell 100 having the highest voltage among the battery cells 100, in the comparative example. In addition, the drawing shows a relationship between the time from the charge start time, and the voltage difference $\Delta V$ (absolute value) between the maximum voltage cell and the lowest temperature cell, in the fourth embodiment. As compared with the first embodiment, attention is paid to a point that portions assigned signs of a and b are different from each other. In addition, FIG. 14(c) shows a relationship between the time from the discharge start time, and the residual capacity $C_a$ of the battery cell 100 having the lowest voltage and the residual capacity $C_b$ of the battery cell 100 having the highest voltage, in the comparative example. Further, FIG. 14(c) shows a relationship between the time from the discharge start time and the current of the battery cell 100 in the fourth embodiment.

Meanwhile, the interval of the horizontal axis in FIG. 14 is assumed to be the same as the interval of the horizontal axis in FIG. 13.

As shown in FIG. 14(*c*), the discharge is performed at a constant current. The current of all the battery cells 100 is kept constant at a constant current value $I_{D1}$.

As shown in FIG. 14(*a*), similarly, in the comparative example, the temperature difference ΔT between the highest temperature cell and the lowest temperature cell increases monotonically simultaneously with the discharge start. At time $t_1$, the temperature difference ΔT between the highest temperature cell and the lowest temperature cell becomes the reference value $T_1$.

As shown in FIG. 14(*b*), from the discharge start, a difference between the voltage $V_a$ of the minimum voltage cell and the voltage $V_b$ of the maximum voltage cell increases due to a change in internal resistance over time. At time $t_1$, the difference between the voltage $V_b$ of the maximum voltage cell and the voltage $V_a$ of the minimum voltage cell becomes the first reference voltage value $V_1$.

Here, in the comparative example, for example, the battery control unit 400 performs the balance control as follows in order to reduce the difference between the voltage $V_b$ of the maximum voltage cell and the voltage $V_a$ of the minimum voltage cell.

In FIG. 12, for example, first, the battery control unit 400 turns off the second cell switch 206 which is connected to the battery cell 100 having the lowest voltage, and turns on the third cell switch 208 which is disposed in parallel with the battery cell 100. Thereby, it is possible to bypass the battery cell 100 having the lowest voltage. In the meantime, the discharge of other battery cells 100 is continued.

In FIG. 14(*b*), after time $t_1$, the voltage $V_a$ of the battery cell 100 having the lowest voltage is bypassed, and thus rises due to a voltage component having dropped due to the internal resistance. On the other hand, the voltage $V_b$ of the maximum voltage cell continues to drop due to the discharge.

In FIG. 14(*c*), after time $t_1$, the residual capacity $C_a$ of the minimum voltage cell is bypassed, and thus is maintained constant. On the other hand, the residual capacity $C_b$ of the maximum voltage cell decreases linearly due to the discharge.

The battery control unit 400 stops the balance control at time $t_3$ after elapse of a predetermined period. That is, the battery control unit 400 restarts the discharge of the battery cell 100 having the lowest voltage.

In FIG. 14(*b*), at time $t_3$, the voltage $V_a$ of the minimum voltage cell comes close to the voltage $V_b$ of the maximum voltage cell. After time $t_3$, the voltage drops simultaneously with the discharge restart.

In FIG. 14(*c*), at time $t_3$, the residual capacity $C_a$ of the minimum voltage cell is larger than the residual capacity $C_b$ of the maximum voltage cell. The residual capacity of the battery cell 100 targeted for control is different from the residual capacity of other battery cells 100 due to the balance control.

The battery control unit 400 further continues the discharge, and terminates the discharge at time $t_f$. At time $t_f$, the residual capacity $C_a$ of the battery cell 100 having the lowest voltage is maintained to be larger than the residual capacity $C_b$ of the maximum voltage cell.

In this manner, in the comparative example, even when the residual capacities of the respective battery cells 100 are equal to each other, the balance control is performed. For this reason, there is the possibility of the residual capacities of the battery cells 100 varying.

As described above, in the comparative example, even when the balance control is unnecessary, there is the possibility of the battery control unit 400 performing the balance control. Particularly, when the battery pack 10 is under a low-temperature environment, a large difference in internal resistance occurs due to a small temperature difference. In such a case, there is a high possibility of the battery control unit 400 performing unnecessary balance control.

On the other hand, according to the fourth embodiment, it is also possible to obtain the same effect as that in the first embodiment in the discharge. That is, when the cause for the occurrence of the voltage difference between each of the battery cells 100 is a temperature difference between each of the battery cells 100, it is possible for the balance control not to be performed.

Therefore, according to the fourth embodiment, it is possible to stably discharge the battery pack 10 while appropriately determining the cause for the occurrence of the voltage difference between each of the battery cells 100.

Fifth Embodiment

Figure 15:
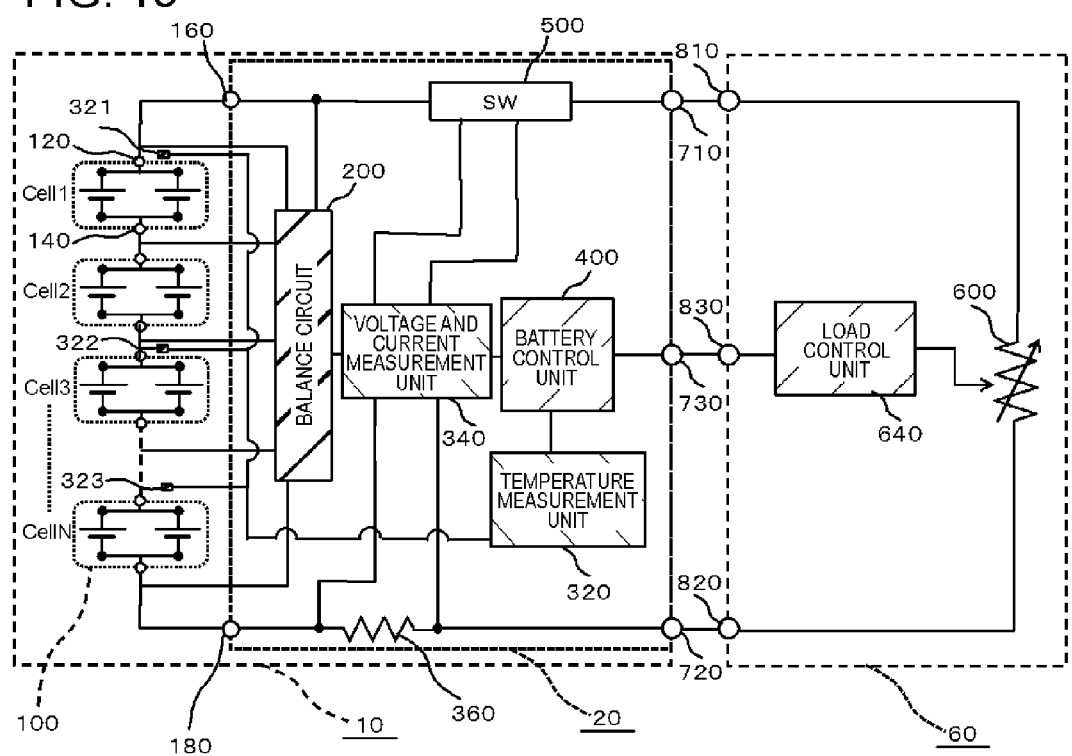
FIG. 15 is a circuit diagram illustrating a configuration of a battery pack according to a fifth embodiment.

A fifth embodiment will be described with reference to FIG. 15. FIG. 15 is a circuit diagram illustrating a configuration of a battery pack 10 according to the fifth embodiment. The fifth embodiment is the same as the second or fourth embodiment, except for the following points. The battery pack 10 of the fifth embodiment further includes the balance circuit 200 that adjusts the voltages of the battery cells 100. In addition, the battery control unit 400 performs the balance control by controlling the balance circuit 200. Hereinafter, a detailed description will be given.

As shown in FIG. 15, in the fifth embodiment, as is the case with the second embodiment, the balance circuit 200 which is a unit that adjusts the voltage of each of the battery cells 100 in the battery control unit 400 is provided independently.

According to the fifth embodiment, the balance circuit 200 is included as a separate system from the battery control unit 400. In such a configuration, it is also possible to obtain the same effect as that in the fourth embodiment.

Sixth Embodiment

Figure 16:
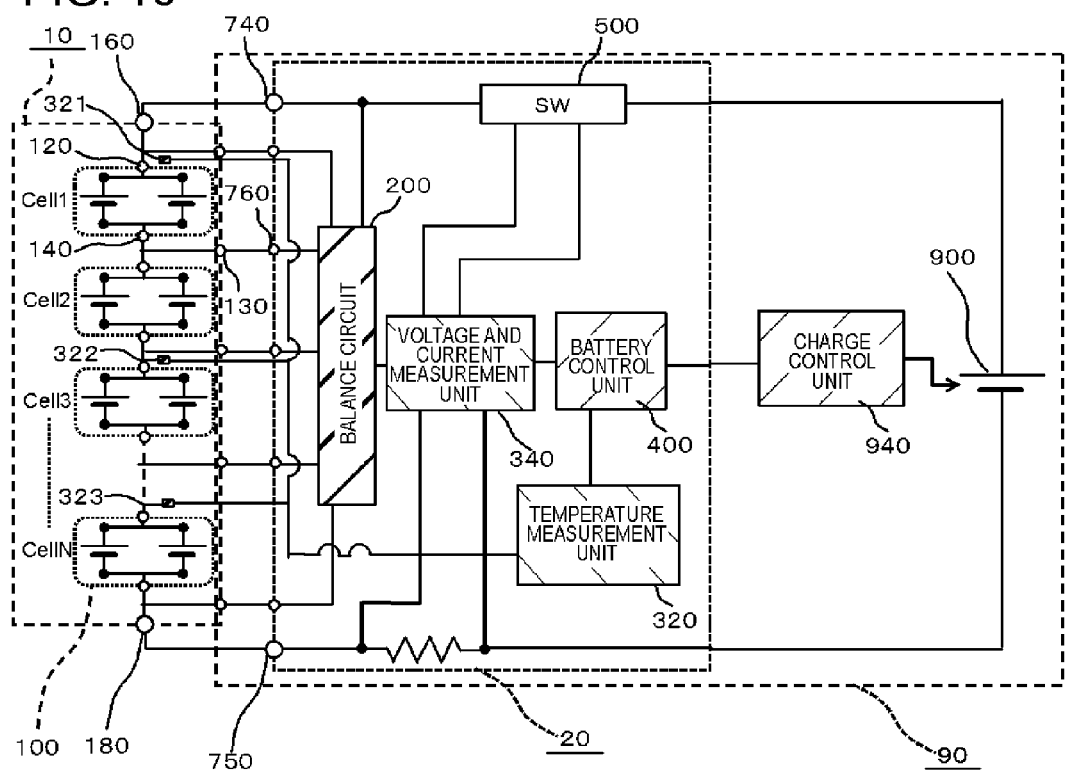
FIG. 16 is a circuit diagram illustrating a configuration of a battery pack according to a sixth embodiment.
Figure 17:
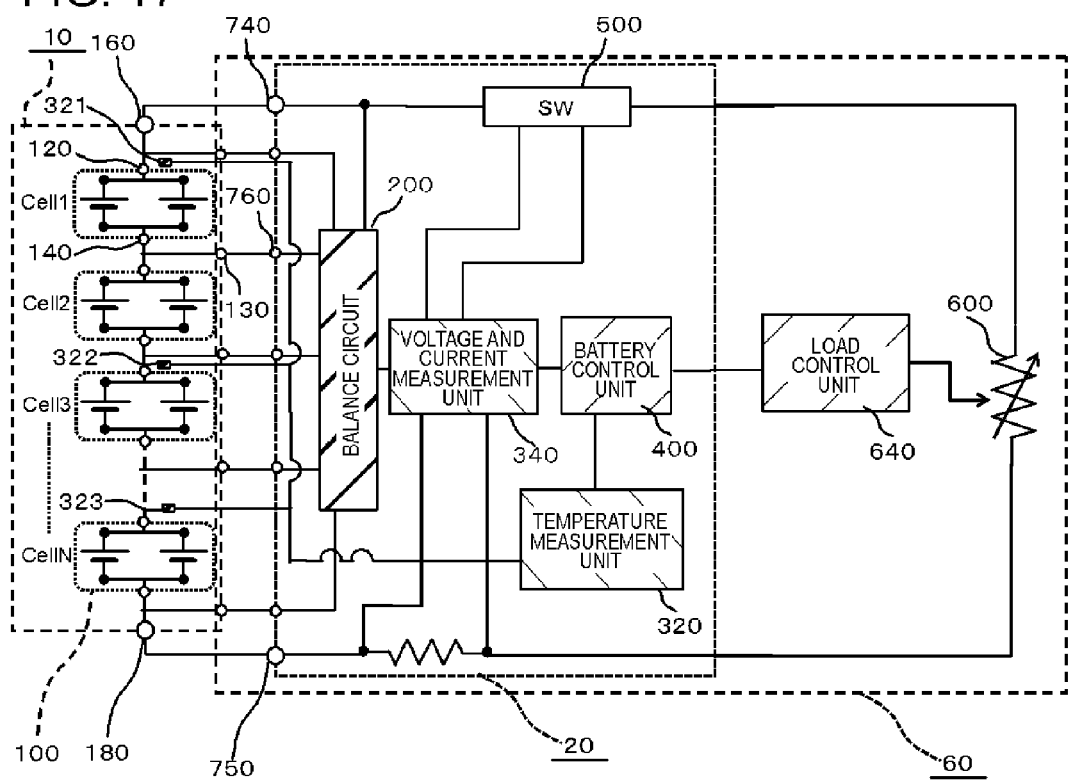
FIG. 17 is a circuit diagram illustrating a configuration of the battery pack according to the sixth embodiment.

FIGS. 16 and 17 are circuit diagrams illustrating a configuration of a battery pack 10 and a control circuit 20 according to a sixth embodiment. The sixth embodiment is the same as the first embodiment, except that the control circuit 20 is provided outside the battery pack 10. Hereinafter, a detailed description will be given.

As shown in FIG. 16, the control circuit 20 is provided outside the battery pack 10. The control circuit 20 is provided in, for example, the charger 60 or the like independent of the battery pack 10.

Alternatively, as shown in FIG. 17, the control circuit 20 may be provided within the electronic device 60 used when the battery pack 10 is discharged.

As is the case with the first embodiment, a plurality of battery cells 100 are connected in series to the battery pack 10. The battery pack 10 is provided with the positive electrode terminal 160 and negative electrode terminal 180 for performing the charge and discharge of the battery pack 10. Besides, a battery cell terminal 130 is provided between each of the battery cells 100.

The control circuit 20 includes the balance circuit 200, the temperature measurement unit 320, the voltage and current measurement unit 340 and the battery control unit 400. The balance circuit 200 is provided on the battery pack 10 side of the control circuit 20. In addition, a positive electrode terminal 740 and a negative electrode terminal 750 of the control circuit 20 are provided on the battery pack 10 side of the control circuit 20. The positive electrode terminal 740 and the negative electrode terminal 750 of the control circuit 20 are respectively connected to the positive electrode terminal 160 and the negative electrode terminal 180 of the battery pack 10 through an interconnect (no sign shown). Thereby, charge power is supplied from the charger 90 side to the battery pack 10. Alternatively, power due to the discharge from the battery pack 10 is supplied to the electronic device 60.

The temperature sensor 321, the temperature sensor 322 and the temperature sensor 323 of the temperature measurement unit 300 are inserted from an opening (not shown) provided to an exterior body (not shown) of the battery pack 10, and are installed on each of the battery cells 100.

In addition, a measurement terminal 760 of the balance circuit 200 is provided on the battery pack 10 side of the control circuit 20. The measurement terminal 760 of the balance circuit 200 is connected to the battery cell terminal 130 of the battery pack 10 through an interconnect (no sign shown). Thereby, even when the control circuit 20 is provided outside the battery pack 10, it is possible to control each of the battery cells 100 at the time of bringing the balance circuit 200 into operation.

According to the sixth embodiment, the control circuit 20 is provided outside the battery pack 10. The balance circuit 200 is connected to each of the battery cell 100 through an interconnect. Thereby, it is possible to obtain the same effect as that in the first embodiment.

In the aforementioned embodiments, a case has been described in which the battery control unit 400 transmits a signal to the switch 500 through the voltage and current measurement unit 340, but the battery control unit 400 may transmit a signal directly to the switch 500.

As described above, although the embodiments of the present invention have been set forth with reference to the drawings, they are merely illustrative of the present invention, and various configurations other than those stated above can be adopted. For example, in the above embodiments, a case where the battery cell 100 is a laminate-type battery has been described, but the effect of the present invention can be obtained similarly even when the battery cell 100 is a battery having other forms such as a cylindrical shape and a square shape.

The application claims priority from Japanese Patent Application No. 2012-44631 filed on Feb. 29, 2012, the content of which is incorporated herein by reference in its entirety.

The invention claimed is:

1. A battery control system comprising:
a temperature measurement unit that measures temperatures of two or more battery units of a plurality of battery units which are connected in series to each other;
a voltage measurement unit that measures voltages of the battery units;
an electrification detection unit that detects electrification of the battery units; and
a battery control unit that controls charge and discharge of the battery units,
wherein the battery control unit,
specifies a lowest temperature unit in which the temperature is lowest and a highest temperature unit in which the temperature is highest, on the basis of the temperatures measured by the temperature measurement unit, during the electrification of the battery units,
further performs balance control for reducing a difference between the voltages of at least two battery units, on the basis of the voltages measured by the voltage measurement unit, when a first temperature condition in which a temperature difference between the highest temperature unit and the lowest temperature unit is equal to or greater than a reference value is not satisfied, and
does not perform the balance control when the temperature difference satisfies the first temperature condition.

2. The battery control system according to claim 1, further comprising a balance circuit that adjusts the voltages of the battery units,
wherein the battery control unit performs the balance control by controlling the balance circuit.

3. The battery control system according to claim 1, wherein the battery control unit changes the reference value of the temperature difference in the first temperature condition on the basis of the temperatures of the battery units.

4. The battery control system according to claim 3, wherein the reference value of the temperature difference becomes smaller as the temperature of the lowest temperature unit or the highest temperature unit becomes lower.

5. The battery control system according to claim 1, wherein the battery control unit,
further specifies a first unit in which the voltage is highest when the charge of the battery units is performed, on the basis of the voltages measured by the voltage measurement unit,
does not perform the balance control when the temperature difference satisfies the first temperature condition, and the lowest temperature unit is the same as the first unit, and
performs the balance control when the temperature difference satisfies the first temperature condition, and the lowest temperature unit is different from the first unit.

6. The battery control system according to claim 1, wherein in the balance control, when a difference between the voltages of a maximum voltage unit in which the voltage is highest and a minimum voltage unit in which the voltage is lowest is equal to or greater than a first reference voltage value, control is performed so that the difference between the voltages decreases.

7. The battery control system according to claim 1, wherein in the balance control, when there is a battery unit in which a difference between the voltage thereof and an average voltage of the battery units is equal to or greater than a second reference voltage value, control is performed so that the difference between the voltages decreases on the basis of the voltages measured by the voltage measurement unit.

8. The battery control system according to claim 1, wherein the temperature measurement unit measures the temperatures of:
at least one battery unit which is disposed at an outermost side; and
the battery unit which is located further inside than the at least one battery unit.

9. A battery pack comprising:
a plurality of battery units which are connected in series to each other;
a temperature measurement unit that measures temperatures of the two or more battery units;
a voltage measurement unit that measures voltages of the battery units;

an electrification detection unit that detects electrification of the battery units; and
a battery control unit that controls charge and discharge of the battery units,
wherein the battery control unit,
specifies a lowest temperature unit in which the temperature is lowest and a highest temperature unit in which the temperature is highest, on the basis of the temperatures measured by the temperature measurement unit, during the electrification of the battery units,
performs balance control for reducing a difference between the voltages of at least two battery units, on the basis of the voltages measured by the voltage measurement unit, when a first temperature condition in which a temperature difference between the highest temperature unit and the lowest temperature unit is equal to or greater than a reference value is not satisfied, and
does not perform the balance control when the temperature difference satisfies the first temperature condition.

* * * * *